United States Patent
Hazelzet

(10) Patent No.: US 7,870,459 B2
(45) Date of Patent: *Jan. 11, 2011

(54) HIGH DENSITY HIGH RELIABILITY MEMORY MODULE WITH POWER GATING AND A FAULT TOLERANT ADDRESS AND COMMAND BUS

(75) Inventor: Bruce G. Hazelzet, New Port Richey, FL (US)

(73) Assignee: International Business Machines Corporation, Armonk, NY (US)

( * ) Notice: Subject to any disclaimer, the term of this patent is extended or adjusted under 35 U.S.C. 154(b) by 1115 days.

This patent is subject to a terminal disclaimer.

(21) Appl. No.: 11/551,866

(22) Filed: Oct. 23, 2006

(65) Prior Publication Data

US 2008/0098277 A1    Apr. 24, 2008

(51) Int. Cl.
*H03M 13/00* (2006.01)
(52) U.S. Cl. ...................... 714/753; 361/760
(58) Field of Classification Search ................ 714/753; 361/760; 365/63
See application file for complete search history.

(56) References Cited

U.S. PATENT DOCUMENTS

| | | | |
|---|---|---|---|
| 2,842,682 A | 7/1958 | Clapper | |
| 3,333,253 A | 7/1967 | Sahulka | |
| 3,395,400 A | 7/1968 | De Witt | |
| 3,825,904 A | 7/1974 | Burk et al. | 340/172.5 |

(Continued)

FOREIGN PATENT DOCUMENTS

EP    0229316 A2    7/1987

(Continued)

OTHER PUBLICATIONS

Yang, Q.; Bhuyan, L.N., "Analysis of packet-switched multiple-bus multiprocessor systems," Computers, IEEE Transactions on, vol. 40, No. 3, pp. 352-357, Mar. 1991.

(Continued)

*Primary Examiner*—Sam Rizk
(74) *Attorney, Agent, or Firm*—Cantor Colburn LLP

(57) ABSTRACT

A high density high reliability memory module with power gating and a fault tolerant address and command bus. The memory module includes a rectangular printed circuit board having a first side and a second side, a length of between 149 and 153 millimeters and first and second ends having a width smaller than said length. The memory module also includes a first plurality of connector locations on the first side extending along a first edge of said board that extends the length of the board and a second plurality of connector locations on the second side extending on said first edge of said board. The memory module further includes a buffer device in communication with the circuit board for accessing up to four ranks of memory devices mounted on the first side and second side of the circuit board. In addition, a power savings means is included for causing all or a portion of the buffer device to be in an inactive mode in response to current activity at the memory module. The memory module also includes a locating key having its center positioned on said first edge and located between 82 mm and 86 mm from said first end of said card and located between 66 and 70 mm from said second end of said card.

12 Claims, 17 Drawing Sheets

FRONT SIDE OF DIMM - 72 PLANAR

BACK SIDE OF DIMM - 72 PLANAR

U.S. PATENT DOCUMENTS

| | | | |
|---|---|---|---|
| 4,028,675 A | 6/1977 | Frankenberg | 711/106 |
| 4,135,240 A | 1/1979 | Ritchie | |
| 4,150,428 A | 4/1979 | Inrig et al. | |
| 4,472,780 A | 9/1984 | Chenoweth et al. | |
| 4,475,194 A | 10/1984 | LaVallee et al. | 371/10 |
| 4,479,214 A | 10/1984 | Ryan | |
| 4,486,739 A | 12/1984 | Franaszek et al. | 340/347 |
| 4,641,263 A | 2/1987 | Perlman et al. | |
| 4,654,857 A | 3/1987 | Samson et al. | |
| 4,723,120 A | 2/1988 | Petty, Jr. | 340/825.02 |
| 4,740,916 A | 4/1988 | Martin | 364/900 |
| 4,782,487 A | 11/1988 | Smelser | |
| 4,796,231 A | 1/1989 | Pinkham | 365/189.05 |
| 4,803,485 A | 2/1989 | Rypinski | 370/452 |
| 4,833,605 A | 5/1989 | Terada et al. | 364/200 |
| 4,839,534 A | 6/1989 | Clasen | 307/269 |
| 4,943,984 A | 7/1990 | Pechanek et al. | 375/109 |
| 4,964,129 A | 10/1990 | Bowden, III et al. | |
| 4,964,130 A | 10/1990 | Bowden, III et al. | |
| 4,985,828 A | 1/1991 | Shimizu et al. | 364/200 |
| 5,053,947 A | 10/1991 | Heibel et al. | 364/200 |
| 5,177,375 A | 1/1993 | Ogawa et al. | |
| 5,206,946 A | 4/1993 | Brunk | 710/2 |
| 5,214,747 A | 5/1993 | Cok | 395/27 |
| 5,265,049 A | 11/1993 | Takasugi | |
| 5,265,212 A | 11/1993 | Bruce, II | 710/113 |
| 5,287,531 A | 2/1994 | Rogers, Jr. et al. | 395/800 |
| 5,347,270 A | 9/1994 | Matsuda et al. | 340/2.21 |
| 5,357,621 A | 10/1994 | Cox | |
| 5,375,127 A | 12/1994 | Leak | |
| 5,387,911 A | 2/1995 | Gleichert et al. | 341/95 |
| 5,394,535 A | 2/1995 | Ohuchi | 711/155 |
| 5,410,545 A | 4/1995 | Porter et al. | |
| 5,454,091 A | 9/1995 | Sites et al. | 395/413 |
| 5,475,690 A | 12/1995 | Burns et al. | 370/105.3 |
| 5,513,135 A | 4/1996 | Dell et al. | 365/52 |
| 5,517,626 A | 5/1996 | Archer et al. | |
| 5,522,064 A | 5/1996 | Aldereguia et al. | |
| 5,544,309 A | 8/1996 | Chang et al. | |
| 5,546,023 A | 8/1996 | Borkar et al. | |
| 5,561,826 A | 10/1996 | Davies et al. | |
| 5,592,632 A | 1/1997 | Leung et al. | 395/306 |
| 5,594,925 A | 1/1997 | Harder et al. | |
| 5,611,055 A | 3/1997 | Krishan et al. | 395/281 |
| 5,613,077 A | 3/1997 | Leung et al. | 395/306 |
| 5,627,963 A | 5/1997 | Gabillard et al. | 714/42 |
| 5,629,685 A | 5/1997 | Allen et al. | 340/825.02 |
| 5,661,677 A | 8/1997 | Rondeau, II et al. | 365/63 |
| 5,666,480 A | 9/1997 | Leung et al. | 395/180 |
| 5,684,418 A | 11/1997 | Yanagiuchi | |
| 5,706,346 A | 1/1998 | Katta et al. | |
| 5,737,589 A | 4/1998 | Doi et al. | |
| 5,754,804 A | 5/1998 | Cheselka et al. | |
| 5,764,155 A | 6/1998 | Kertesz et al. | 340/825.08 |
| 5,822,749 A | 10/1998 | Agarwal | 707/2 |
| 5,852,617 A | 12/1998 | Mote, Jr. | 714/726 |
| 5,870,320 A | 2/1999 | Volkonsky | |
| 5,870,325 A | 2/1999 | Nielsen et al. | 365/63 |
| 5,872,996 A | 2/1999 | Barth et al. | 395/853 |
| 5,881,154 A | 3/1999 | Nohara et al. | |
| 5,917,760 A | 6/1999 | Millar | |
| 5,926,838 A | 7/1999 | Jeddeloh | 711/167 |
| 5,928,343 A | 7/1999 | Farmwald et al. | 710/104 |
| 5,930,273 A | 7/1999 | Mukojima | 714/776 |
| 5,959,914 A | 9/1999 | Gates et al. | |
| 5,973,951 A | 10/1999 | Bechtolsheim et al. | 365/52 |
| 5,974,493 A | 10/1999 | Okumura et al. | 710/307 |
| 5,995,405 A | 11/1999 | Trick | 365/63 |
| 6,003,121 A | 12/1999 | Wirt | |
| 6,011,732 A | 1/2000 | Harrison et al. | |
| 6,038,132 A | 3/2000 | Tokunaga et al. | 361/760 |
| 6,049,476 A | 4/2000 | Laudon et al. | 365/52 |
| 6,076,158 A | 6/2000 | Sites et al. | 712/230 |
| 6,078,515 A | 6/2000 | Nielsen et al. | 365/63 |
| 6,081,868 A | 6/2000 | Brooks | |
| 6,085,276 A | 7/2000 | VanDoren et al. | |
| 6,088,817 A | 7/2000 | Haulin | |
| 6,096,091 A | 8/2000 | Hartmann | 716/17 |
| 6,128,746 A | 10/2000 | Clark et al. | 713/324 |
| 6,145,028 A | 11/2000 | Shank et al. | |
| 6,158,040 A | 12/2000 | Ho | |
| 6,170,047 B1 | 1/2001 | Dye | 711/170 |
| 6,170,059 B1 | 1/2001 | Pruett et al. | 713/200 |
| 6,173,382 B1 | 1/2001 | Dell et al. | 711/170 |
| 6,185,718 B1 | 2/2001 | Dell et al. | |
| 6,198,304 B1 | 3/2001 | Sasaki | |
| 6,215,686 B1 | 4/2001 | Deneroff et al. | 365/52 |
| 6,216,247 B1 | 4/2001 | Creta et al. | |
| 6,219,288 B1 | 4/2001 | Braceras et al. | |
| 6,219,760 B1 | 4/2001 | McMinn | |
| 6,233,639 B1 | 5/2001 | Dell et al. | |
| 6,260,127 B1 | 7/2001 | Olarig et al. | 711/167 |
| 6,262,493 B1 | 7/2001 | Garnett | |
| 6,285,172 B1 | 9/2001 | Torbey | |
| 6,292,903 B1 | 9/2001 | Coteus et al. | 713/401 |
| 6,301,636 B1 | 10/2001 | Schultz et al. | 711/108 |
| 6,308,247 B1 | 10/2001 | Ackerman et al. | |
| 6,317,352 B1 | 11/2001 | Halbert et al. | 365/52 |
| 6,321,343 B1 | 11/2001 | Toda | 713/600 |
| 6,338,113 B1 | 1/2002 | Kubo et al. | 711/105 |
| 6,349,390 B1 | 2/2002 | Dell et al. | |
| 6,357,018 B1 | 3/2002 | Stuewe et al. | |
| 6,370,631 B1 | 4/2002 | Dye | 711/170 |
| 6,378,018 B1 | 4/2002 | Tsern et al. | 710/129 |
| 6,381,685 B2 | 4/2002 | Dell et al. | |
| 6,393,512 B1 | 5/2002 | Chen et al. | |
| 6,393,528 B1 | 5/2002 | Arimilli et al. | 711/137 |
| 6,408,398 B1 | 6/2002 | Freker et al. | |
| 6,425,044 B1 | 7/2002 | Jeddeloh | |
| 6,446,174 B1 | 9/2002 | Dow | |
| 6,446,224 B1 | 9/2002 | Chang et al. | |
| 6,461,013 B1 | 10/2002 | Simon | |
| 6,467,013 B1 | 10/2002 | Nizar | |
| 6,473,836 B1 | 10/2002 | Ikeda | 711/137 |
| 6,477,614 B1 | 11/2002 | Leddige et al. | |
| 6,477,615 B1 | 11/2002 | Tanaka | |
| 6,483,755 B2 | 11/2002 | Leung et al. | 365/189.05 |
| 6,484,271 B1 | 11/2002 | Gray | |
| 6,487,102 B1 | 11/2002 | Halbert et al. | |
| 6,487,627 B1 | 11/2002 | Willke et al. | 710/306 |
| 6,493,250 B2 | 12/2002 | Halbert et al. | 365/63 |
| 6,496,540 B1 | 12/2002 | Widmer | 375/242 |
| 6,496,910 B1 | 12/2002 | Baentsch et al. | 711/165 |
| 6,499,070 B1 | 12/2002 | Whetsel | |
| 6,502,161 B1 | 12/2002 | Perego et al. | 711/5 |
| 6,505,305 B1 | 1/2003 | Olarig | |
| 6,507,888 B2 | 1/2003 | Wu et al. | 711/105 |
| 6,510,100 B2 | 1/2003 | Grundon et al. | 365/233 |
| 6,513,091 B1 | 1/2003 | Blackmon et al. | 710/316 |
| 6,526,469 B1 | 2/2003 | Drehmel et al. | |
| 6,530,007 B2 | 3/2003 | Olarig | |
| 6,532,525 B1 | 3/2003 | Aleksic et al. | 711/168 |
| 6,546,359 B1 | 4/2003 | Week | 702/186 |
| 6,549,971 B1 | 4/2003 | Cecchi et al. | 710/306 |
| 6,553,450 B1 | 4/2003 | Dodd et al. | 711/105 |
| 6,557,069 B1 | 4/2003 | Drehmel et al. | 710/307 |
| 6,564,329 B1 | 5/2003 | Cheung et al. | 713/322 |
| 6,584,576 B1 | 6/2003 | Co | |
| 6,587,912 B2 | 7/2003 | Leddige et al. | |
| 6,590,827 B2 | 7/2003 | Chang et al. | |
| 6,594,713 B1 | 7/2003 | Fuoco et al. | |
| 6,594,748 B1 | 7/2003 | Lin | |
| 6,601,121 B2 | 7/2003 | Singh et al. | 710/112 |
| 6,601,149 B1 | 7/2003 | Brock et al. | |

| Patent Number | Date | Inventor | Ref |
|---|---|---|---|
| 6,604,180 B2 | 8/2003 | Jeddeloh | |
| 6,611,905 B1 | 8/2003 | Grundon et al. | 711/167 |
| 6,622,217 B2 | 9/2003 | Gharacorloo et al. | 711/141 |
| 6,622,227 B2 | 9/2003 | Zumkehr et al. | |
| 6,625,687 B1 | 9/2003 | Halber et al. | 711/105 |
| 6,625,702 B2 | 9/2003 | Rentscler et al. | |
| 6,628,538 B2 | 9/2003 | Funaba et al. | 365/63 |
| 6,631,439 B2 | 10/2003 | Saulsbury et al. | |
| 6,636,957 B2 | 10/2003 | Stevens et al. | |
| 6,643,745 B1 | 11/2003 | Palanca et al. | |
| 6,671,376 B1 | 12/2003 | Koto et al. | 380/210 |
| 6,678,811 B2 | 1/2004 | Rentschler et al. | 711/167 |
| 6,681,292 B2 | 1/2004 | Creta et al. | |
| 6,684,320 B2 | 1/2004 | Mohamed et al. | |
| 6,697,919 B2 | 2/2004 | Gharachorloo et al. | 711/141 |
| 6,704,842 B1 | 3/2004 | Janakiraman et al. | |
| 6,721,185 B2 | 4/2004 | Dong et al. | |
| 6,721,944 B2 | 4/2004 | Chaudhry et al. | |
| 6,738,836 B1 | 5/2004 | Kessler et al. | |
| 6,741,096 B2 | 5/2004 | Moss | |
| 6,748,518 B1 | 6/2004 | Guthrie et al. | |
| 6,754,762 B1 | 6/2004 | Curley | |
| 6,766,389 B2 | 7/2004 | Hayter et al. | |
| 6,775,747 B2 | 8/2004 | Venkatraman | |
| 6,791,555 B1 | 9/2004 | Radke et al. | |
| 6,792,495 B1 | 9/2004 | Garney et al. | |
| 6,799,241 B2 | 9/2004 | Kahn et al. | |
| 6,832,329 B2 | 12/2004 | Ahrens et al. | |
| 6,839,393 B1 | 1/2005 | Sidiropoulos | 375/371 |
| 6,845,472 B2 | 1/2005 | Walker et al. | |
| 6,847,583 B2 | 1/2005 | Janzen et al. | |
| 6,851,036 B1 | 2/2005 | Toda et al. | |
| 6,874,102 B2 | 3/2005 | Doody et al. | |
| 6,877,076 B1 | 4/2005 | Cho et al. | |
| 6,877,078 B2 | 4/2005 | Fujiwara et al. | |
| 6,882,082 B2 | 4/2005 | Greeff et al. | |
| 6,889,284 B1 | 5/2005 | Nizar et al. | |
| 6,898,726 B1 | 5/2005 | Lee | |
| 6,910,146 B2 | 6/2005 | Dow | |
| 6,918,068 B2 | 7/2005 | Vail et al. | |
| 6,925,534 B2 | 8/2005 | David | |
| 6,938,119 B2 | 8/2005 | Kohn et al. | |
| 6,944,084 B2 | 9/2005 | Wilcox | |
| 6,948,091 B2 | 9/2005 | Bartels et al. | |
| 6,949,950 B2 | 9/2005 | Takahashi et al. | |
| 6,952,761 B2 | 10/2005 | John | |
| 6,965,952 B2 | 11/2005 | Echartea et al. | |
| 6,977,536 B2 | 12/2005 | Chin-Chieh et al. | 327/116 |
| 6,977,979 B1 | 12/2005 | Hartwell et al. | |
| 6,993,612 B2 | 1/2006 | Porterfield | |
| 6,996,639 B2 | 2/2006 | Narad | |
| 6,996,766 B2 | 2/2006 | Cypher | |
| 7,039,755 B1 | 5/2006 | Helms | |
| 7,047,370 B1 | 5/2006 | Jeter, Jr. et al. | |
| 7,047,371 B2 | 5/2006 | Dortu | |
| 7,047,384 B2 | 5/2006 | Bodas et al. | |
| 7,051,172 B2 | 5/2006 | Mastronarde et al. | |
| 7,076,700 B2 | 7/2006 | Rieger | |
| 7,091,890 B1 | 8/2006 | Sasaki et al. | |
| 7,103,792 B2 | 9/2006 | Moon | |
| 7,120,743 B2 | 10/2006 | Meyer et al. | |
| 7,133,790 B2 | 11/2006 | Liou | |
| 7,133,972 B2 | 11/2006 | Jeddeloh | |
| 7,155,016 B1 | 12/2006 | Betts et al. | |
| 7,177,211 B2 | 2/2007 | Zimmerman | |
| 7,194,593 B2 | 3/2007 | Schnepper | |
| 7,197,594 B2 | 3/2007 | Raz et al. | |
| 7,197,670 B2 | 3/2007 | Boatright et al. | |
| 7,203,318 B2 | 4/2007 | Collum et al. | |
| 7,206,887 B2 | 4/2007 | Jeddeloh | |
| 7,206,962 B2 | 4/2007 | Deegan | |
| 7,210,059 B2 | 4/2007 | Jeddeloh | |
| 7,216,196 B2 | 5/2007 | Jeddeloh | |
| 7,216,276 B1 | 5/2007 | Azimi et al. | |
| 7,222,213 B2 | 5/2007 | James | |
| 7,227,949 B2 | 6/2007 | Heegard et al. | |
| 7,240,145 B2 | 7/2007 | Holman | |
| 7,260,685 B2 | 8/2007 | Lee et al. | |
| 7,266,634 B2 | 9/2007 | Ware et al. | |
| 7,269,765 B1 | 9/2007 | Charlton et al. | |
| 7,296,129 B2 | 11/2007 | Gower et al. | |
| 7,313,583 B2 | 12/2007 | Porten et al. | |
| 7,319,340 B2 | 1/2008 | Jeddeloh et al. | |
| 7,321,979 B2 | 1/2008 | Lee | |
| 7,334,159 B1 | 2/2008 | Callaghan | |
| 7,353,316 B2 | 4/2008 | Erdmann | |
| 7,363,419 B2 | 4/2008 | Cronin et al. | |
| 7,363,436 B1 | 4/2008 | Yeh et al. | |
| 7,370,134 B2 | 5/2008 | Jeddeloh | |
| 7,376,146 B2 | 5/2008 | Beverly et al. | |
| 7,386,575 B2 | 6/2008 | Bashant et al. | |
| 7,386,771 B2 | 6/2008 | Shuma | |
| 7,404,118 B1 | 7/2008 | Baguette et al. | |
| 7,418,526 B2 | 8/2008 | Jeddeloh | |
| 7,421,525 B2 | 9/2008 | Polzin et al. | |
| 7,430,145 B2 | 9/2008 | Weiss et al. | |
| 7,433,258 B2 | 10/2008 | Rao et al. | |
| 7,551,468 B2 * | 6/2009 | Dreps et al. | 365/63 |
| 2001/0000822 A1 | 5/2001 | Dell et al. | 711/170 |
| 2001/0003839 A1 | 6/2001 | Kondo | 711/144 |
| 2001/0029566 A1 | 10/2001 | Shin | |
| 2001/0029592 A1 | 10/2001 | Walker et al. | |
| 2002/0019926 A1 | 2/2002 | Huppenthal et al. | 712/15 |
| 2002/0038405 A1 | 3/2002 | Leddige et al. | 711/115 |
| 2002/0059439 A1 | 5/2002 | Arroyo et al. | |
| 2002/0083255 A1 | 6/2002 | Greeff et al. | 710/305 |
| 2002/0103988 A1 | 8/2002 | Dornier | 712/38 |
| 2002/0112119 A1 | 8/2002 | Halbert et al. | 711/115 |
| 2002/0112194 A1 | 8/2002 | Uzelac | 713/500 |
| 2002/0124195 A1 | 9/2002 | Nizar | 713/320 |
| 2002/0124201 A1 | 9/2002 | Edwards et al. | |
| 2002/0147898 A1 | 10/2002 | Rentschler et al. | 711/170 |
| 2002/0174274 A1 | 11/2002 | Wu et al. | 710/100 |
| 2003/0009632 A1 | 1/2003 | Arimilli et al. | |
| 2003/0028701 A1 | 2/2003 | Rao et al. | |
| 2003/0033364 A1 | 2/2003 | Garnett et al. | 709/203 |
| 2003/0051055 A1 | 3/2003 | Parrella et al. | |
| 2003/0056183 A1 | 3/2003 | Kobayashi | |
| 2003/0084309 A1 | 5/2003 | Kohn | 713/189 |
| 2003/0090879 A1 | 5/2003 | Doblar et al. | 361/728 |
| 2003/0105938 A1 | 6/2003 | Cooksey et al. | |
| 2003/0118044 A1 | 6/2003 | Blanc et al. | |
| 2003/0126354 A1 | 7/2003 | Kahn et al. | |
| 2003/0126363 A1 | 7/2003 | David | |
| 2003/0223303 A1 | 12/2003 | Lamb et al. | 365/230.06 |
| 2003/0229770 A1 | 12/2003 | Jeddeloh | |
| 2003/0235222 A1 | 12/2003 | Bridges et al. | |
| 2003/0236959 A1 | 12/2003 | Johnson et al. | 711/167 |
| 2004/0006674 A1 | 1/2004 | Hargis et al. | 711/156 |
| 2004/0015650 A1 | 1/2004 | Zumkehr et al. | |
| 2004/0049723 A1 | 3/2004 | Obara | 714/729 |
| 2004/0078615 A1 | 4/2004 | Martin et al. | |
| 2004/0098546 A1 | 5/2004 | Bashant et al. | |
| 2004/0098549 A1 | 5/2004 | Dorst | |
| 2004/0117588 A1 | 6/2004 | Arimilli et al. | 711/203 |
| 2004/0123222 A1 | 6/2004 | Widmer | |
| 2004/0128474 A1 | 7/2004 | Vorbach | 712/10 |
| 2004/0148482 A1 | 7/2004 | Grundy et al. | |
| 2004/0160832 A1 | 8/2004 | Janzen et al. | |
| 2004/0163028 A1 | 8/2004 | Olarig | |
| 2004/0165609 A1 | 8/2004 | Herbst et al. | |
| 2004/0199363 A1 | 10/2004 | Bohizic et al. | |
| 2004/0205433 A1 | 10/2004 | Gower et al. | |
| 2004/0230718 A1 | 11/2004 | Polzin et al. | 710/22 |
| 2004/0246767 A1 | 12/2004 | Vogt | 365/154 |
| 2004/0250153 A1 | 12/2004 | Vogt | 713/500 |

| | | | | | | |
|---|---|---|---|---|---|---|
| 2004/0260909 | A1 | 12/2004 | Lee et al. ............ 711/213 | 2008/0222379 A1 | 9/2008 | Jeddeloh |
| 2004/0260957 | A1 | 12/2004 | Jeddeloh et al. | 2009/0006900 A1 | 1/2009 | Lastras-Montano et al. |
| 2005/0022065 | A1 | 1/2005 | Dixon et al. | | | |
| 2005/0023560 | A1 | 2/2005 | Ahn et al. ............ 257/200 | | | |
| 2005/0027941 | A1 | 2/2005 | Wang et al. | | | |
| 2005/0044305 | A1 | 2/2005 | Jakobs et al. | | | |
| 2005/0050237 | A1 | 3/2005 | Jeddeloh et al. ........... 710/10 | | | |
| 2005/0050255 | A1 | 3/2005 | Jeddeloh ............ 710/317 | | | |
| 2005/0066136 | A1 | 3/2005 | Schnepper ............ 711/154 | | | |
| 2005/0071542 | A1 | 3/2005 | Weber et al. | | | |
| 2005/0071707 | A1 | 3/2005 | Hampel | | | |
| 2005/0078506 | A1 | 4/2005 | Rao et al. | | | |
| 2005/0080581 | A1 | 4/2005 | Zimmerman et al. ........ 702/117 | | | |
| 2005/0081085 | A1 | 4/2005 | Ellis et al. | | | |
| 2005/0081114 | A1 | 4/2005 | Ackaret et al. | | | |
| 2005/0081129 | A1 | 4/2005 | Shah et al. | | | |
| 2005/0086424 | A1 | 4/2005 | Oh et al. | | | |
| 2005/0086441 | A1 | 4/2005 | Myer et al. | | | |
| 2005/0097249 | A1 | 5/2005 | Oberlin et al. | | | |
| 2005/0105350 | A1 | 5/2005 | Zimmerman et al. | | | |
| 2005/0120157 | A1 | 6/2005 | Chen et al. ............ 710/313 | | | |
| 2005/0125702 | A1 | 6/2005 | Huang et al. | | | |
| 2005/0125703 | A1 | 6/2005 | Lefurgy et al. | | | |
| 2005/0138246 | A1 | 6/2005 | Chen et al. | | | |
| 2005/0138267 | A1 | 6/2005 | Bains et al. | | | |
| 2005/0144399 | A1 | 6/2005 | Hosomi ............ 711/145 | | | |
| 2005/0149665 | A1 | 7/2005 | Wolrich et al. | | | |
| 2005/0166006 | A1 | 7/2005 | Talbot et al. | | | |
| 2005/0177677 | A1 | 8/2005 | Jeddeloh | | | |
| 2005/0177690 | A1 | 8/2005 | LaBerge ............ 711/154 | | | |
| 2005/0204216 | A1 | 9/2005 | Daily et al. ............ 714/724 | | | |
| 2005/0216678 | A1 | 9/2005 | Jeddeloh | | | |
| 2005/0220097 | A1 | 10/2005 | Swami et al. | | | |
| 2005/0223196 | A1 | 10/2005 | Knowles | | | |
| 2005/0229132 | A1 | 10/2005 | Butt et al. ............ 716/10 | | | |
| 2005/0248997 | A1 | 11/2005 | Lee | | | |
| 2005/0257005 | A1 | 11/2005 | Jeddeloh et al. | | | |
| 2005/0259496 | A1 | 11/2005 | Hsu et al. ............ 365/226 | | | |
| 2005/0289292 | A1 | 12/2005 | Morrow et al. | | | |
| 2005/0289377 | A1 | 12/2005 | Luong | | | |
| 2006/0004953 | A1 | 1/2006 | Vogt | | | |
| 2006/0010339 | A1 | 1/2006 | Klein | | | |
| 2006/0036826 | A1 | 2/2006 | Dell et al. | | | |
| 2006/0036827 | A1 | 2/2006 | Dell et al. | | | |
| 2006/0080584 | A1 | 4/2006 | Hartnett et al. | | | |
| 2006/0085602 | A1 | 4/2006 | Huggahalli et al. | | | |
| 2006/0095592 | A1 | 5/2006 | Borkenhagen | | | |
| 2006/0095679 | A1 | 5/2006 | Edirisooriya | | | |
| 2006/0104371 | A1 | 5/2006 | Schuermans et al. | | | |
| 2006/0107175 | A1 | 5/2006 | Dell et al. | | | |
| 2006/0112238 | A1 | 5/2006 | Jamil et al. | | | |
| 2006/0161733 | A1 | 7/2006 | Beckett et al. | | | |
| 2006/0162882 | A1 | 7/2006 | Ohara et al. | | | |
| 2006/0168407 | A1 | 7/2006 | Stern | | | |
| 2006/0179208 | A1 | 8/2006 | Jeddeloh | | | |
| 2006/0190674 | A1 | 8/2006 | Poechmueller | | | |
| 2006/0195631 | A1 | 8/2006 | Rajamani | | | |
| 2006/0206742 | A1 | 9/2006 | James | | | |
| 2006/0212666 | A1 | 9/2006 | Jeddeloh | | | |
| 2006/0224764 | A1 | 10/2006 | Shinohara et al. | | | |
| 2006/0277365 | A1 | 12/2006 | Pong | | | |
| 2006/0288172 | A1 | 12/2006 | Lee et al. | | | |
| 2007/0005922 | A1 | 1/2007 | Swaminathan et al. | | | |
| 2007/0025304 | A1 | 2/2007 | Leelahakriengkrai et al. | | | |
| 2007/0038907 | A1 | 2/2007 | Jeddeloh et al. | | | |
| 2007/0067382 | A1 | 3/2007 | Sun | | | |
| 2007/0083701 | A1 | 4/2007 | Kapil | | | |
| 2007/0160053 | A1 | 7/2007 | Coteus et al. | | | |
| 2008/0043808 | A1 | 2/2008 | Hsu et al. | | | |
| 2008/0162807 | A1 | 7/2008 | Rothman et al. | | | |
| 2008/0163014 | A1 | 7/2008 | Crawford et al. | | | |

FOREIGN PATENT DOCUMENTS

| | | |
|---|---|---|
| EP | 0470734 A1 | 2/1992 |
| EP | 0899743 A2 | 6/1998 |
| EP | 1429340 A2 | 6/2004 |
| GB | 2396711 A | 6/2004 |
| JP | 59153353 A | 9/1984 |
| JP | 0114140 A | 6/1989 |
| JP | 0432614 | 11/1992 |
| JP | 10011971 | 1/1998 |
| JP | 2004139552 A | 5/2004 |
| JP | 2008003711 A | 1/2008 |
| WO | 9621188 | 7/1996 |
| WO | 9812651 | 3/1998 |
| WO | 0004481 A2 | 1/2000 |
| WO | 0223353 A2 | 3/2002 |
| WO | WO2005038660 | 4/2005 |
| WO | 2007109888 | 10/2007 |

OTHER PUBLICATIONS

Li, P; Martinez, J.; Tang, J.; Priore, S.,; Hubbard, K.; Jie Xue; Poh, E.; Ong MeiLin; Chok KengYin; Hallmark, C.; Mendez, D.; "Development and evaluation of a high performance fine pitch SODIMM socket package." Electronic Components and Technology Conference, 2004. Proceedings. 54th, vol. 1, pp. 1161-1166, Jun. 1-4, 2004.

PCT International Search Report PCT/EP2006/068984. Mailed Feb. 16, 2007.

PCT International Search Report PCT/EP2007/057916. Mailed Dec. 14, 2007.

Luca Benini, et al., "System-Level Powers Optimization: Techniques and Tools", ACM Transactions on Design Automation of Electronic Systems, vol. 5, No. 2, Apr. 2000, pp. 115-192.

Boudon, et al., "Novel Bus Reconfiguration Scheme With Spare Lines", IBM Technical Disclosure Bulletin, May 1987, vol. 29, No. 12; pp. 1-3.

Brown, at al "Compiler-Based I/O Prefetching for Out-of-Core Applications", ACM Transactions on Computer Systems, vol. 19, No. 2, May 2001, pp. 111-170.

Ghoneima et al.; "Optimum Positioning of Interleaved Repeaters in Bidirectional Buses;" IEEE Transactions on Computer-Aided Design of Integrated Circuits and Systems, vol. 25, No. 3, Mar. 2005, pp. 461-469.

JEDEC Solid State Technology Association, "JEDEC Standard: DDR2 SDRAM Specification", Jan. 2004, JEDEC, Revision JESD79-2A, p. 10.

Jungjoon Kim et al.; "Performance and Architecture Features of Segmented Multiple Bus System;" IEEE Computer Society; 1999 International Conference on Parallel Processing (ICPP '99).

Massoud Pedram, "Power Minimization in IC Design Principles and Applications", ACM Transactions on Design Automation of Electronic Systems vol. 1, No. 1, Jan. 1996, pp. 3-56.

Natarajan, et al., "A Study of Performance Impact of Memory Controller Features in Multi-Processor Server Environment", pp. 80-87.

NB940259 (IBM Technical Disclosure Bulletin, Feb. 1994; vol. 37; pp. 59-64).

Nilsen, "High-Level Dynamic Memory Management for Object-Oriented Real-Time Systems", pp. 86-93.

P.R. Panda, "Data and Memory Optimization Techniques for Embedded Systems", ACM Transactions on Design Automation of Electronic Systems, vol. 6, No. 2, Apr. 2001, pp. 149-206.

Penrod, Lee, "Understanding System Memory and CPU Speeds: A laymans guide to the Front Side Bus (FSB)", Dec. 28, 2005, Direction . Org, pp. 1-5, http://www.directron.com/directron/fsbguide.html. [online]; [retrieved on Feb. 23, 2006]; retrieved from the Internet.

Seceleanu et al.; "Segment Arbiter as Action System;" IEEE 2003 pp. 249-252.

Singh, S., et al., "Bus Sparing for Fault-Tolerant System Design", IBM Technical Disclosure Bulletin, Dec. 1991, vol. 34, No. 71, pp. 117-118.

Sivencrona et al.; "RedCAN™: Simulations of two Fault Recovery Algorithms for CAN;" Proceedings for the 10th IEEE Pacific Rim International Symposium on Dependable Computing (PRDC'04); 2005.

U.S. Appl. No. 11/419,586, filed May 22, 2006. Robert Tremaine. "Systems and Methods for Providing Remote Pre-Fetch Buffers".

Wang, et al., "Guided Region Prefetching: A Cooperative Hardware/Software Approach", pp. 388-398.

Wikipedia, Serial Communications, [online], [retrieved Apr. 10, 2007 from the Internet], http://en.wikipedia.org/wiki/Serial_communications, 3 pages.

International Search Report, International Application No. PCT/EP2007/054929, International Publication No. WO 2007/135144 A1.

IEEE, "IEEE Standard Test Access Port and Boundary-Scan Architecture", Jul. 23, 2001, IEEE Std 1149-1-2001, pp. 11-13.

Rosenberg, "Dictionary of Computers, Information Processing & Telecommuications", Second Edition, John Wiley & Sons, Inc. 1987. 3 pgs.

IBM. IBM WebSphere Enerprise Service Bus. Version 6.0.2 2006 (165-0071-USC NOA Jun. 12, 2009).

BEA Systems Inc. Integration of Clustered BEA AquaLogic Service Bus Domain and Remote Tibco Enterprise Message Service 4.2.0 for Messaging Application in SOA. BEA White Paper. 2006 (165-0071-USC NOA Jun. 12, 2009).

Oracle. Oracle Enterprise Service Bus. Oracle Data Sheet. Oct. 2006 (165-0071-USC NOA Jun. 12, 2009).

Joe Jeddeloh, Fully Buffered DIMM (FB-DIMM), XP002490174, Advanced Systems Technology, Micron Technology, Inc. Apr. 16, 2008, 32 pages.

Timothy J. Dell, "The RAS Implications of DIMM Connector Failure Rates in Large, Highly Available Server Systems", The 53rd IEEE Holm Conference on Electrical Contacts, IEEE, Sep. 16-19, 2007, pp. 256-261.

"Using Dual and Mappable Spare Bus", XP000433763, IBM Technical Disclosure Bulletin, vol. 37, No. 2B, IBM Copr., NY, US, Feb. 1, 1994, pp. 59-63.

"Novel Bus Reconfiguration Scheme With Spare Lines", XP000676205, IBM Technical Disclosure Bulletin, vol. 29, No. 12, IBM Copr., NY, US, May 12, 1987, pp. 5590-5593.

European Search Report, European Patent Application 05106700.7.

International Search Report, International Patent Application No. PCT/US07/75944, mailed Sep. 23, 2008, 3 pages.

European Search Report, European Patent Application No. 05106701.5, mailed Oct. 7, 2008, 5 pages.

European Search Report, European Patent Application No. 05109837.4, mailed Oct. 7, 2008, 5 pages.

PCT Search Report. PCT/EP2007/057915. Mailed Nov. 7, 2007.

* cited by examiner

FRONT SIDE OF DIMM - 72 PLANAR

BACK SIDE OF DIMM - 72 PLANAR

FRONT SIDE OF DIMM - 4 HIGH STACK

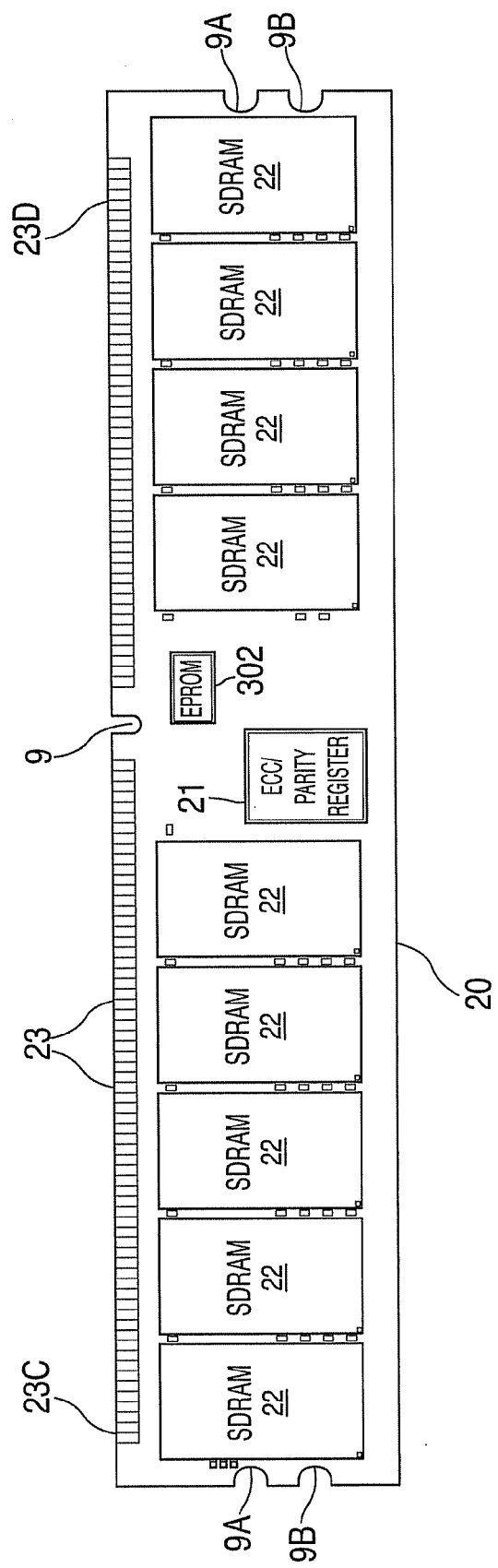
FIG. 3D   BACK SIDE OF DIMM - 4 HIGH STACK

|    | D0 | D1 | D2 | D3 | D4 | D5 | D6 | D7 | D8 | D9 | D10 | D11 | D12 | D13 | D14 | D15 | D16 | D17 | D18 | D19 | D20 | D21 | C0 | C1 | C2 | C3 | C4 | C5 |
|----|----|----|----|----|----|----|----|----|----|----|-----|-----|-----|-----|-----|-----|-----|-----|-----|-----|-----|-----|----|----|----|----|----|----|
| S0 | 1 | 1 | 1 | 0 | 0 | 1 | 1 | 0 | 1 | 0 | 0 | 0 | 0 | 1 | 1 | 0 | 0 | 1 | 0 | 1 | 0 | 1 | 1 | 0 | 0 | 0 | 0 | 0 |
| S1 | 1 | 1 | 1 | 1 | 0 | 0 | 1 | 1 | 0 | 1 | 1 | 0 | 0 | 0 | 1 | 1 | 0 | 0 | 1 | 0 | 1 | 0 | 0 | 1 | 0 | 0 | 0 | 0 |
| S2 | 0 | 0 | 1 | 1 | 1 | 1 | 0 | 0 | 1 | 0 | 1 | 1 | 0 | 0 | 0 | 0 | 1 | 0 | 0 | 1 | 1 | 1 | 0 | 0 | 1 | 0 | 0 | 0 |
| S3 | 1 | 0 | 0 | 0 | 1 | 0 | 1 | 1 | 1 | 1 | 0 | 1 | 1 | 0 | 0 | 1 | 0 | 1 | 0 | 0 | 1 | 1 | 0 | 0 | 0 | 1 | 0 | 0 |
| S4 | 1 | 1 | 0 | 0 | 1 | 1 | 0 | 0 | 0 | 1 | 0 | 0 | 1 | 1 | 0 | 0 | 1 | 0 | 1 | 0 | 1 | 1 | 0 | 0 | 0 | 0 | 1 | 0 |
| S5 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 0 | 0 | 0 | 0 | 0 | 1 |

FIG. 6

| SERVER DIMM PIN NUMBER | PIN NAME | SERVER DIMM PIN NUMBER | PIN NAME |
|---|---|---|---|
| 1 | Vref | 139 | Vref |
| 2 | SCL | 140 | SCL |
| 3 | SDA | 141 | SDA |
| 4 | UE | 142 | UE |
| 5 | CE | 143 | CE |
| 6 | VDD | 144 | VDD |
| 7 | ECCMODE | 145 | ECCMODE |
| 8 | DLY CKE/ODT | 146 | DLY CKE/ODT |
| 9 | CS GATE EN | 147 | CS GATE EN |
| 10 | GND | 148 | GND |
| 11 | DQ0 | 149 | DQ4 |
| 12 | DQ1 | 150 | DQ5 |
| 13 | GND | 151 | GND |
| 14 | DQS0* | 152 | DQS9 |
| 15 | DQS0 | 153 | DQS9* |
| 16 | GND | 154 | GND |
| 17 | DQ2 | 155 | DQ6 |
| 18 | DQ3 | 156 | DQ7 |
| 19 | GND | 157 | GND |
| 20 | VDD | 158 | VDD |
| 21 | GND | 159 | GND |
| 22 | DQ8 | 160 | DQ12 |
| 23 | DQ9 | 161 | DQ13 |
| 24 | GND | 162 | GND |
| 25 | DQS1* | 163 | DQS10 |
| 26 | DQS1 | 164 | DQS10* |
| 27 | GND | 165 | GND |
| 28 | DQ10 | 166 | DQ14 |
| 29 | DQ11 | 167 | DQ15 |
| 30 | GND | 168 | GND |
| 31 | DQ16 | 169 | DQ20 |
| 32 | DQ17 | 170 | DQ21 |
| 33 | GND | 171 | GND |
| 34 | DQS2* | 172 | DQS11 |
| 35 | DQS2 | 173 | DQS11* |
| 36 | GND | 174 | GND |
| 37 | DQ18 | 175 | DQ22 |
| 38 | DQ19 | 176 | DQ23 |
| 39 | GND | 177 | GND |
| 40 | RESET | 178 | RESET |
| 41 | VDD | 179 | VDD |
| 42 | GND | 180 | GND |
| 43 | DQ24 | 181 | DQ28 |
| 44 | DQ25 | 182 | DQ29 |
| 45 | GND | 183 | GND |
| 46 | DQS3* | 184 | DQS12 |
| 47 | DQS3 | 185 | DQS12* |
| 48 | GND | 186 | GND |
| 49 | DQ26 | 187 | DQ30 |
| 50 | DQ27 | 188 | DQ31 |
| 51 | GND | 189 | GND |
| 52 | CB0 | 190 | CB4 |

FIG. 7A

| | | | |
|---|---|---|---|
| 53 | CB1 | 191 | CB5 |
| 54 | GND | 192 | GND |
| 55 | DQS8* | 193 | DQS17 |
| 56 | DQS8 | 194 | DQS17* |
| 57 | GND | 195 | GND |
| 58 | CB2 | 196 | CB6 |
| 59 | CB3 | 197 | CB7 |
| 60 | GND | 198 | GND |
| 61 | VDD | 199 | VDD |
| 62 | CKE1 | 200 | CKE1 |
| 63 | CHKBT4 | 201 | CHKBT1 |
| 64 | CHKBT5 | 202 | CHKBT3 |
| 65 | CKE0 | 203 | CKE0 |
| 66 | VDD | 204 | VDD |
| 67 | A15 | 205 | A14 |
| 68 | BA2 | 206 | A12 |
| 69 | CHKBT0/PTY | 207 | A9 |
| 70 | A11 | 208 | CHKBT2 |
| 71 | VDD | 209 | VDD |
| 72 | A7 | 210 | A8 |
| 73 | A5 | 211 | A6 |
| 74 | A4 | 212 | A3 |
| 75 | A2 | 213 | A1 |
| 76 | VDD | 214 | VDD |
| 77 | CK0 | 215 | CK0 |
| 78 | CK0B | 216 | CK0B |
| 79 | VDD | 217 | VDD |
| 80 | GND | 218 | GND |
| 81 | VDD | 219 | VDD |
| 82 | A10 | 220 | A0 |
| 83 | BA0 | 221 | BA1 |
| 84 | WE | 222 | RAS |
| 85 | VDD | 223 | VDD |
| 86 | CS0 | 224 | CS0 |
| 87 | CAS | 225 | CS3 |
| 88 | ODT0 | 226 | ODT0 |
| 89 | CS3 | 227 | A13 |
| 90 | VDD | 228 | VDD |
| 91 | CS1 | 229 | CS1 |
| 92 | ODT1 | 230 | ODT1 |
| 93 | CS2 | 231 | CS2 |
| 94 | VDD | 232 | VDD |
| 95 | GND | 233 | GND |
| 96 | DQ32 | 234 | DQ36 |
| 97 | DQ33 | 235 | DQ37 |
| 98 | GND | 236 | GND |
| 99 | DQS4* | 237 | DQS13 |
| 100 | DQS4 | 238 | DQS13* |
| 101 | GND | 239 | GND |
| 102 | DQ34 | 240 | DQ38 |

FIG. 7B

| | | | |
|---|---|---|---|
| 103 | DQ35 | 241 | DQ39 |
| 104 | GND | 242 | GND |
| 105 | DQ40 | 243 | DQ44 |
| 106 | DQ41 | 244 | DQ45 |
| 107 | GND | 245 | GND |
| 108 | DQS5* | 246 | DQS14 |
| 109 | DQS5 | 247 | DQS14* |
| 110 | GND | 248 | GND |
| 111 | DQ42 | 249 | DQ46 |
| 112 | DQ43 | 250 | DQ47 |
| 113 | GND | 251 | GND |
| 114 | DQ48 | 252 | DQ52 |
| 115 | DQ49 | 253 | DQ53 |
| 116 | GND | 254 | GND |
| 117 | DQS6* | 255 | DQS15 |
| 118 | DQS6 | 256 | DQS15* |
| 119 | GND | 257 | GND |
| 120 | DQ50 | 258 | DQ54 |
| 121 | DQ51 | 259 | DQ55 |
| 122 | GND | 260 | GND |
| 123 | DQ56 | 261 | DQ60 |
| 124 | DQ57 | 262 | DQ61 |
| 125 | GND | 263 | GND |
| 126 | DQS7* | 264 | DQS16 |
| 127 | DQS7 | 265 | DQS16* |
| 128 | GND | 266 | GND |
| 129 | DQ58 | 267 | DQ62 |
| 130 | DQ59 | 268 | DQ63 |
| 131 | GND | 269 | GND |
| 132 | VDD | 270 | VDD |
| 133 | SA2 | 271 | SA2 |
| 134 | VDDSPD | 272 | VDDSPD |
| 135 | SDA | 273 | SDA |
| 136 | SCL | 274 | SCL |
| 137 | SA0 | 275 | SA0 |
| 138 | SA1 | 276 | SA1 |

FIG. 7C

| DIMM SLOT | I2C ADDR | 1 REGISTER I2C ADDR | 2 REGISTERS I2C ADDR |
|---|---|---|---|
| 1 | 0 | 0 | 0,4 |
| 2 | 1 | 1 | 1,5 |
| 3 | 2 | 2 | 2,6 |
| 4 | 3 | 3 | 3,7 |
| 5 | 4 | 4 | - |
| 6 | 5 | 5 | - |
| 7 | 6 | 6 | - |
| 8 | 7 | 7 | - |

FIG. 11

HIGH DENSITY HIGH RELIABILITY MEMORY MODULE WITH POWER GATING AND A FAULT TOLERANT ADDRESS AND COMMAND BUS

BACKGROUND OF THE INVENTION

This invention relates generally to a high-density, high-reliability memory module with a fault tolerant address and command bus for use as a main memory that will achieve the degree of fault-tolerance and self-healing necessary for autonomic computing systems.

Memory modules are well known to the prior art and have been and are presently being used in practical applications such as in computers and other equipment using solid state memories.

Broadly speaking, currently available main memories offer bandwidths in the range of 1.6 to 2.6 GB/s, and although some memories provide for limited data path error correction most offer no means of any error correction targeting the interface between the memory controller and the memory subsystem. Furthermore, memory modules for server products and other higher-end computing systems usually include re-drive logic for address and command inputs, and clock re-synchronization and re-drive circuitry associated with the memory subsystems to permit these modules to contain higher memory device counts and to ensure accurate clock timings at each device on the memory assembly. Although these solutions provide systems with the ability to achieve the specified bandwidth objectives, the overall quantity and types of failures in the memory subsystem, outside the data path itself, has actually increased due to the added circuitry associated with each memory device. Simultaneously, as these computing systems are more widely utilized in business, many applications simply cannot accept periodic unplanned system outages caused by failed memory modules. Thus the emphasis and need for improved overall system reliability is increasing dramatically and requires a comprehensive system solution that includes both a high degree of fault tolerance and overall reliability. Further, a corresponding need for greater system memory density is also required to achieve the system performance and operation throughput required in modem business applications, as well as to maximize the return on investment by extending the utility of the system by offering memory density improvements.

The present invention provides such a comprehensive system solution that includes the capability of high memory density and a high degree of fault tolerance and the overall differentiated system reliability long desired in the server market.

Existing solutions have memory module density that is typically limited to 18 or 36 devices for each memory module—with this limit based on such elements as the memory device package size, the memory module physical dimensions, the re-drive capability of the buffer, re-drive or register device, the power dissipation of the completed memory subsystem and/or module, etc. Other possible fault-tolerant improvement methods such as memory mirroring, symbol slicing and extensive forms of fault rejection and redundancy, provide enhanced memory subsystem reliability, but, due to negative impacts such as increased cost, power, and reduced performance, have been considered only for niche applications where price is not of high importance as these subsystem quality enhancements are very expensive to implement. Therefore solutions suitable for the low or midrange server markets have not been available.

Consequently the industry has long sought a simple, relatively inexpensive and reliable solution that provides high memory density with differentiated product quality, that provides an adequate level of asset-protection that does not endanger the reliability of the system through the use of reduced-function memory assemblies and yet is cost competitive.

BRIEF SUMMARY OF THE INVENTION

The present invention is directed to a high density high reliability memory controller/interface module, provided with a high degree of compatibility with industry-standard solutions, capable of meeting the desired density, performance and reliability requirements and interfacing with the presently available memory modules, as well as with existing or enhanced support devices. The present invention accomplishes all these ends, resulting in a high density and enhanced reliability memory solution at low cost.

An object of the present invention is to provide an enhanced 28 bit 1:2 register (also referred to herein as a "buffer") that supports 4 ranks of memory devices, intended for use with memory subsystems such as Dual Inline Memory Modules (DIMMs) having Dynamic Random Access Memory (DRAM) chips thereon. The register of the present invention has added thereto additional command inputs, error correction code (ECC) logic to identify and correct single bit errors on the command or address bus, and permit continuous memory operation independent of the existence of these errors.

Another object of the present invention is to include in such DIMMs error latches and an error reporting mode whereby the system may interrogate the device to determine the error condition thereby allowing accurate fault determination and preventive maintenance—thereby reducing unplanned system outages.

A further object of the present invention is to include redundant contacts on all connectors/DIMM interconnects that would otherwise be considered single points of failure whereby an intermittent or permanent contact failure would result in an unplanned system outage.

Still another object of the present invention is to provide the DIMM with key operational features such as chip select gating of key inputs and programmable delay for un-gated inputs, thereby reducing module power and offering increased operational flexibility.

A further object of the present invention is to provide a DIMM that can be readily utilized in presently available controllers in a manner most applicable to the market needs.

Another further object of the present invention is to have a DIMM that uses connectors similar to those presently in use so that prior art contacts, molds, handlers and related production tools can continue to be used such that the modules can be more cheaply produced with additional density while providing value-added reliability, and other value-add attributes, such as a higher memory packaging density with minimal additional production costs.

Another further object of the present invention is to have a buffer which is operable with up to 4 ranks of memory devices, that is also interchangeable with previously developed buffers limited to no more than 2 ranks of memory devices, and can be used as a direct replacement for said previously developed buffers on DIMMs that utilized said buffers—thereby eliminating the need to produce or procure two types of buffer devices or to re-design existing memory modules.

The DIMM of the present invention is comprised of a printed circuit board having a front side and a back side and a plurality of double data rate (DDR) DRAMs or synchronous dynamic random access memories (SDRAMs) affixed to both the front surface and the back surface. On a first edge of the front surface of said board there is provided one hundred and thirty eight (138) contacts for connecting circuitry, external to the card, to the SDRAMS and related devices on the DIMM and on the same first edge on the rear side of the card there is provided an additional one hundred and thirty eight (138) external circuitry connecting contacts so that the board has a total of two hundred and seventy six (276) external circuitry connecting contacts thereon. The contact means provided on the front and the back sides of the printed circuit card provide for electrically connecting the external circuitry to the SDRAMs in a direct or indirect manner.

Still another further object of the present invention is to provide a server memory structure having a dual inline memory module or DIMM provided with selective redundant contacts, a phase lock loop, 2 or 32K bit serial electronically erasable programmable read only memory (EE PROM) and a 28 bit, 1 to 2 register having error correction code (ECC), parity checking, a multi-byte fault reporting register, read via an independent bus, and real time error lines for both correctable errors and uncorrectable error conditions. More particularly the server of the present invention comprises a novel DIMM provided with a new and unique ECC/Parity Register that is operable with 1 to 4 memory ranks, coupled to a memory interface chip which is in turn coupled to a memory controller or processor such that the memory controller sends address and command information to the buffer (or register) via address/command lines together with check bits for error correction purposes to the ECC/Parity register.

Still another object of the invention is to provide for detecting if the module installed in the server can monitor the address and control bus integrity, correct errors on the address and control bus, report errors and log and counts errors.

Still another object of the invention is to provide for Parity error reporting in which the parity signal is delivered one cycle after the address and command to which it applies, and the error line be driven low two clocks after the address and command bits are driven to the DRAMs from the register on the DIMM. After holding the error line low for only 2 clock cycles, the driver can be disabled and the output permitted to return to an un-driven state (high impedance) thus allowing this line to be shared by multiple modules.

Still further the invention provides means for and a method for adjusting the propagation delay, for signals on the memory module that are not included in the ECC circuitry, such that the signals can be selectively re-driven by the buffer within one or two clock cycles.

Still further the present invention permits operation of the memory module in parity mode, such that unused ECC check bit inputs are held at a low level thus ensuring that these inputs are at a known and quiescent state.

Still further the present invention provides for reducing the probability of Single Point of Failures occurring by providing selected signals with redundant contacts directly on the opposite side of the DIMM from the original function contact thereby reducing the probability of a contact failure resulting in an unplanned system outage.

Still further the present invention provides for operating a module of the present invention consistent with conventional non-ECC protected modules, by removing the secondary registers (post-ECC) from the delay path by setting the /ECC Mode control pin to a high level.

These objects, features and advantages of the present invention will be become further apparent to those skilled in the art from the following detailed description taken in conjunction with the accompanying drawings wherein:

BRIEF DESCRIPTION OF THE DRAWINGS

FIGS. 3C and 3D are plan views respectively of the front and back of the 276 pin DIMM of the present invention that utilizes up to eighteen four high DRAM stacks;

FIG. 6 describes, in H—matrix form, the preferred ECC code selected for the module of FIG. 3;

FIGS. 7A, 7B and 7C show the designated contacts or pin connections for the DIMM of FIGS. 3A and 3B;

FIG. 11 shows the IIC addresses that are utilized to access the error registers on the one or two buffers of the present invention.

DETAILED DESCRIPTION OF EXEMPLARY EMBODIMENTS

Figure 1:
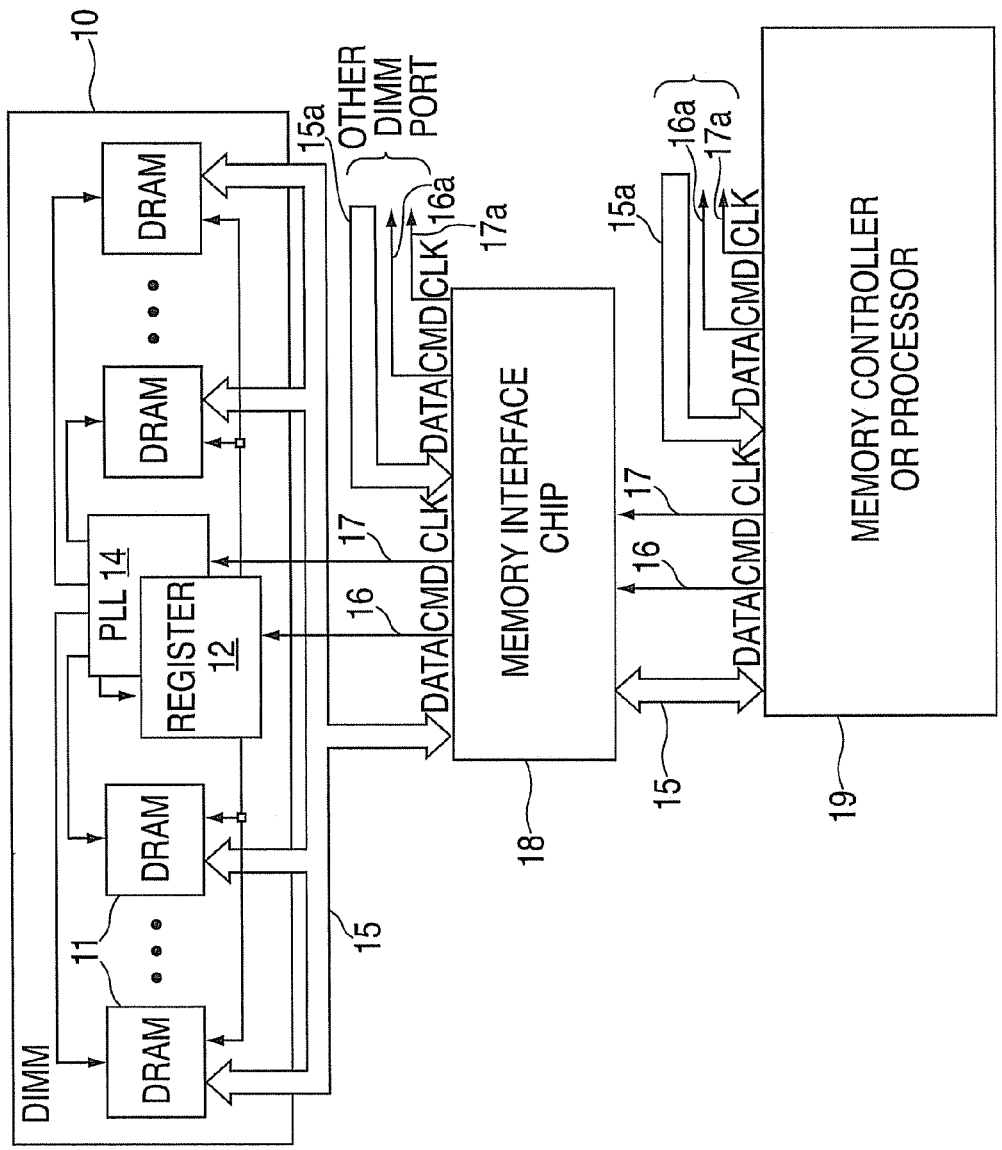
FIG. 1 is a block diagram of a typical server memory arrangement.
Figure 2:
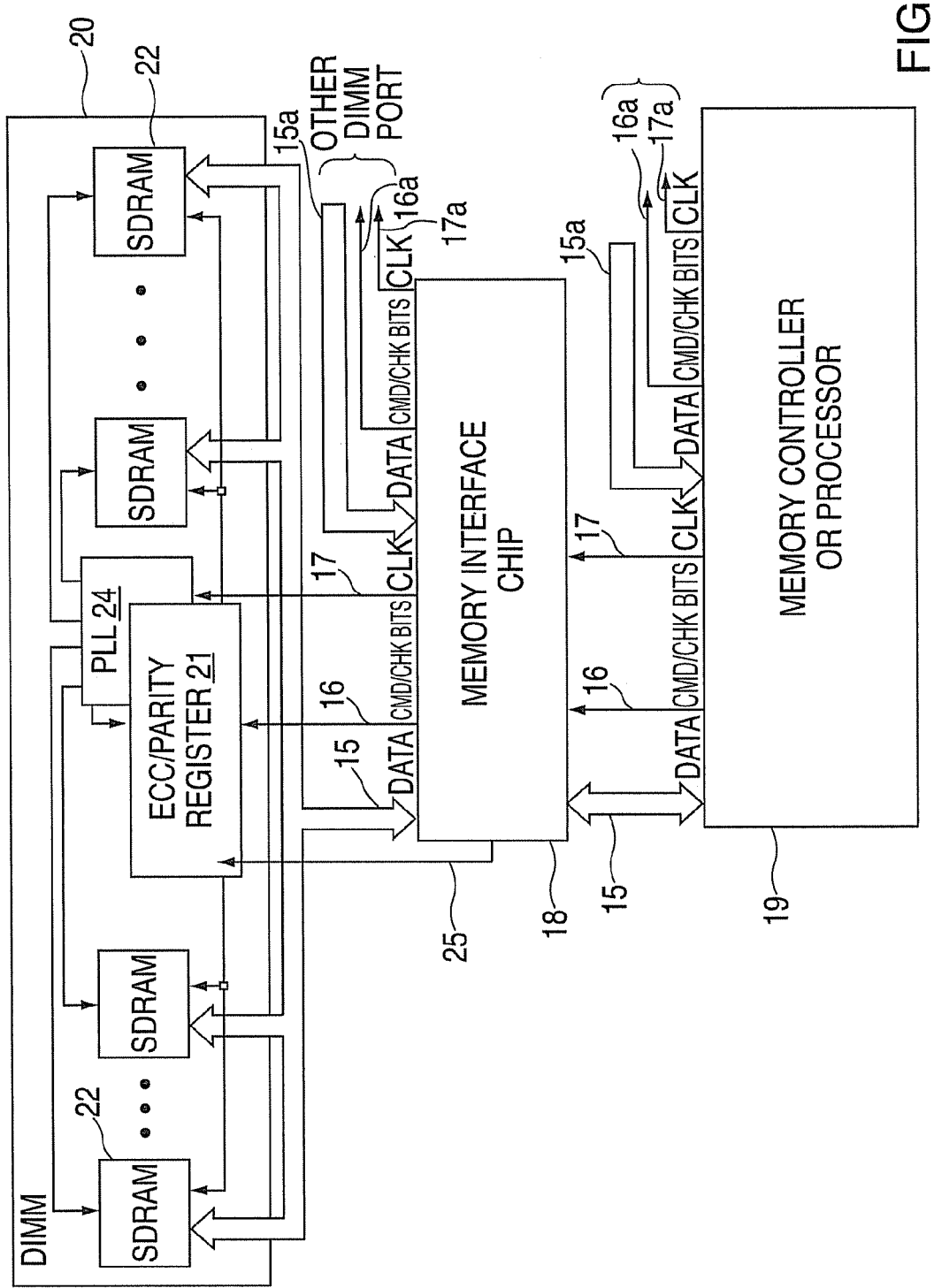
FIG. 2 is a block diagram of the enhanced server memory arrangement of the present invention.
Figure 3A:
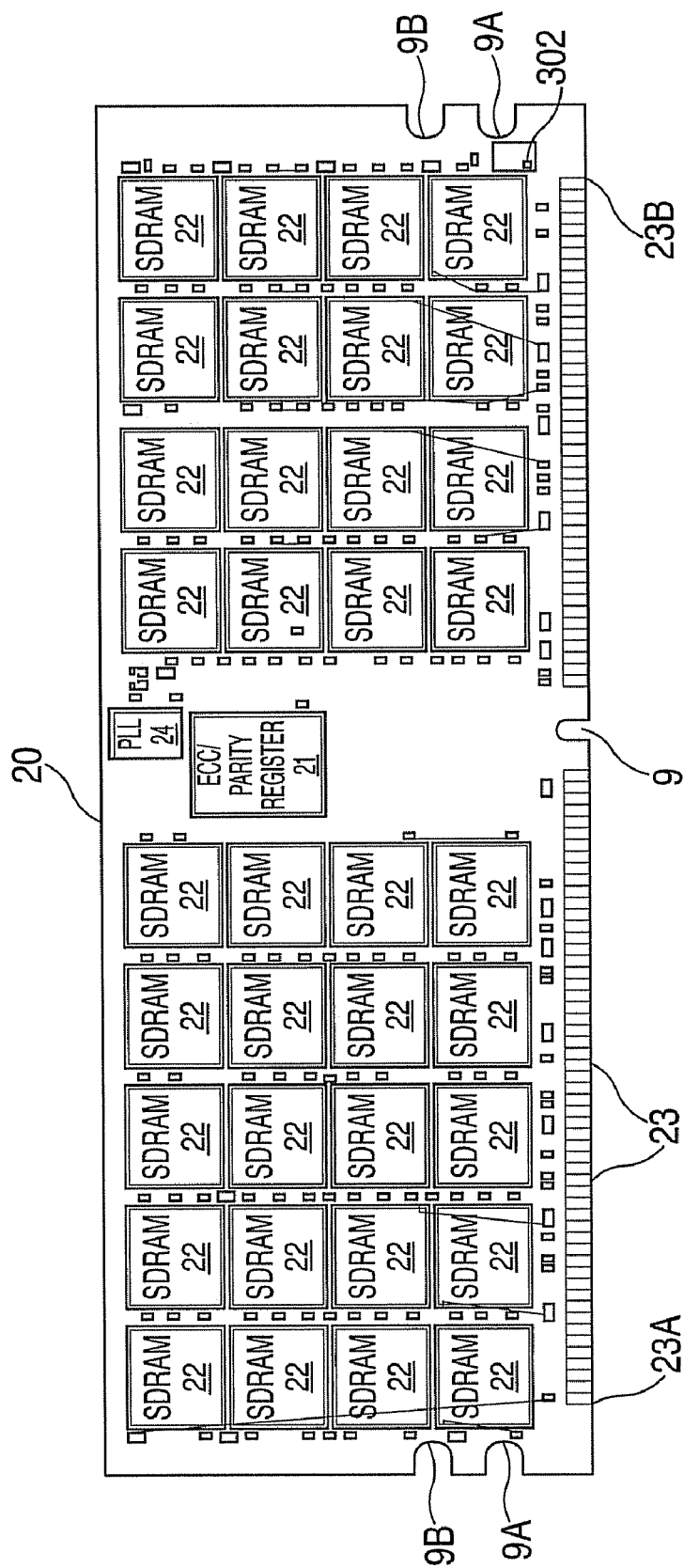
FIGS. 3A and 3B are plan views respectively of the front and back of the two hundred and seventy six (276) pin dual inline memory module (DIMM) of the present invention that utilizes up to 72 planar DRAMS.
Figure 3B:
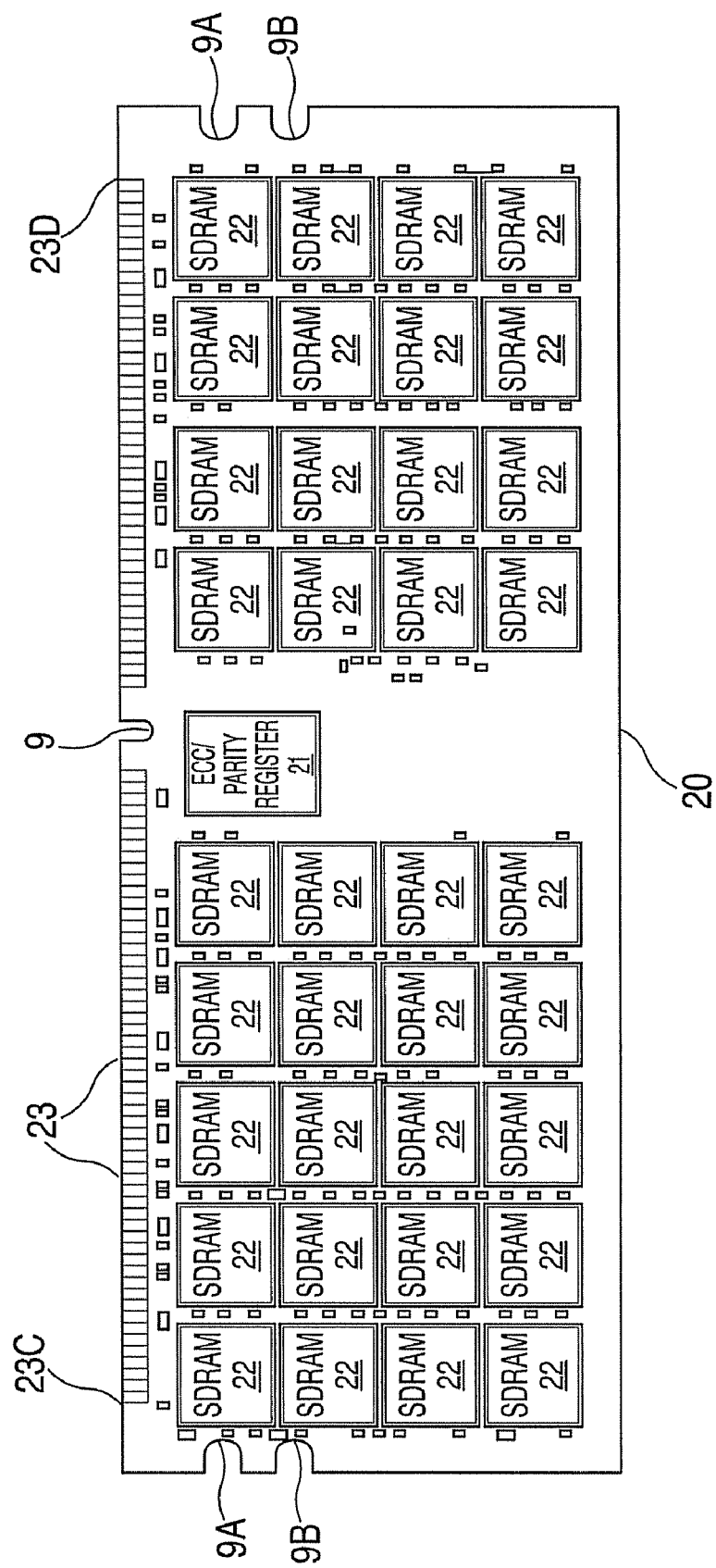
Figure 3C:
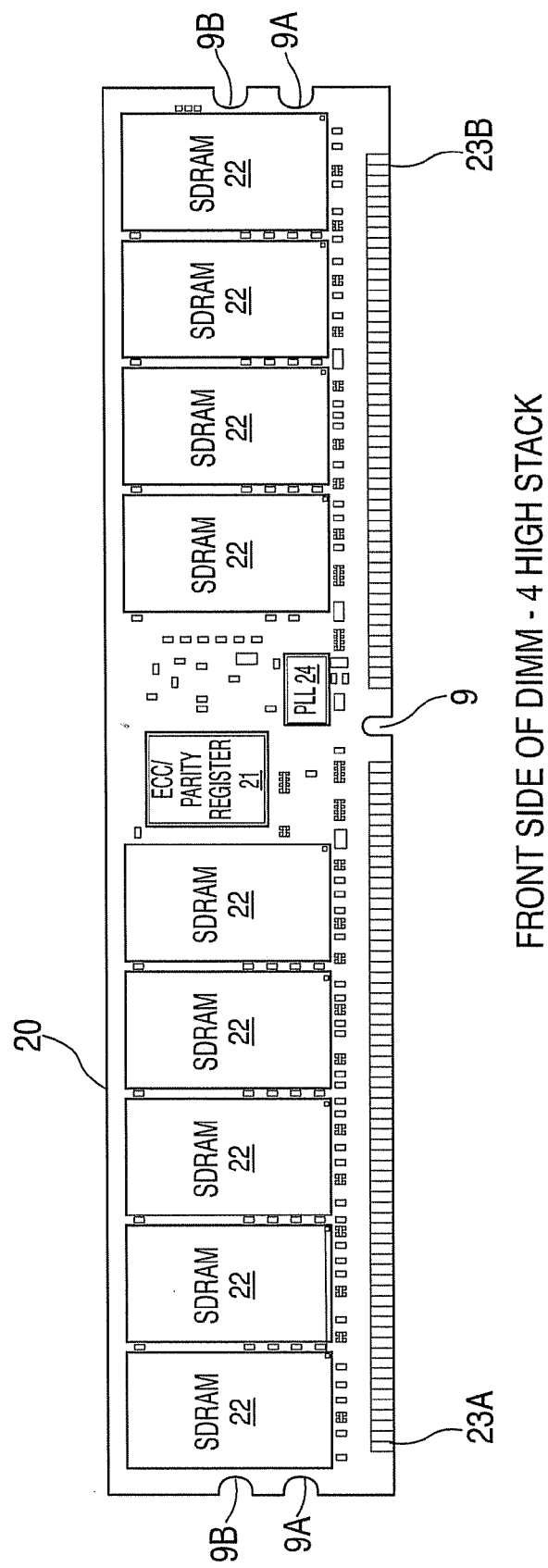
Figure 4A:
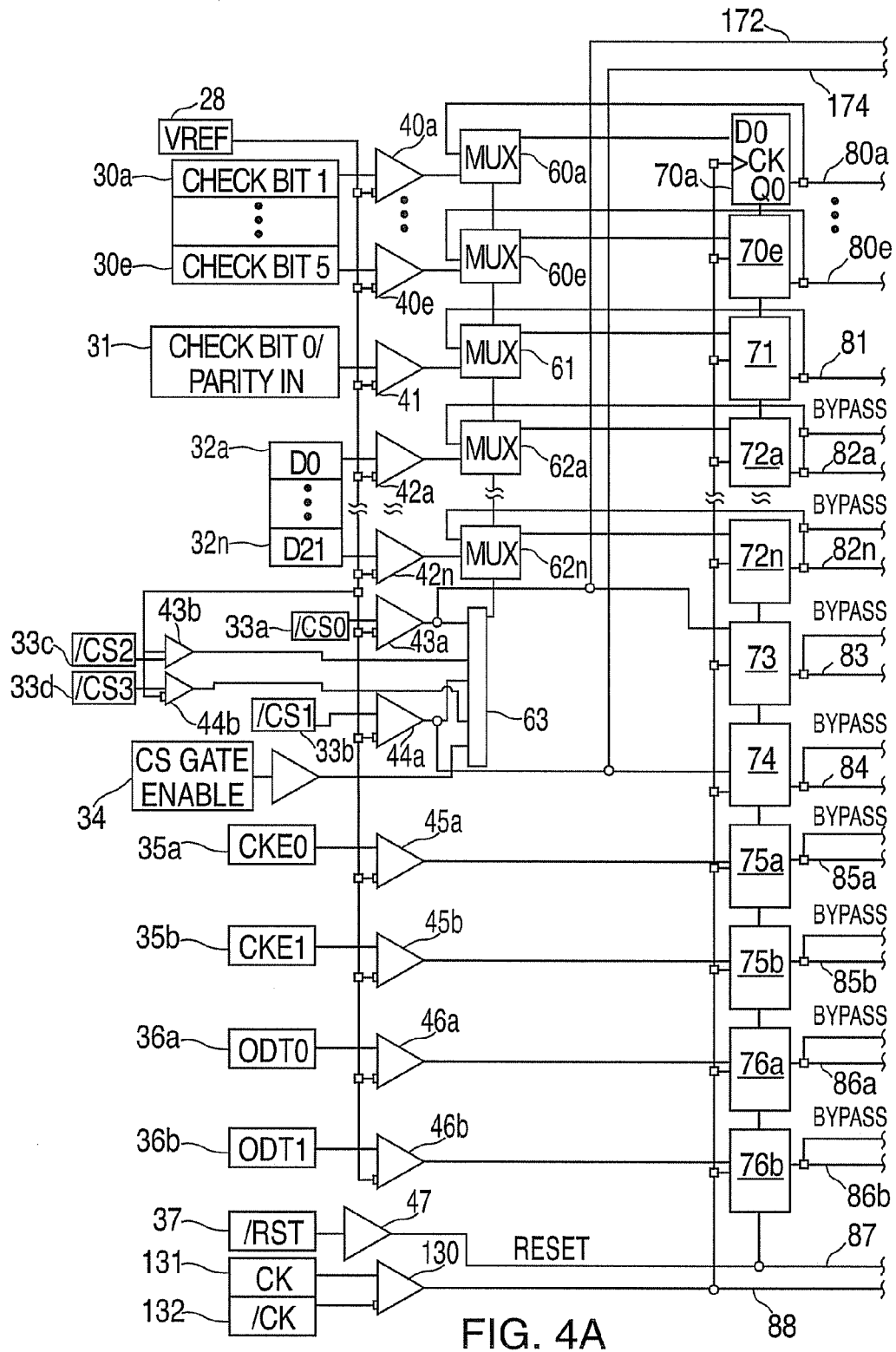
FIGS. 4A and 4B are schematic views of the ECC/Parity register, shown in FIG. 3A.
Figure 4B:
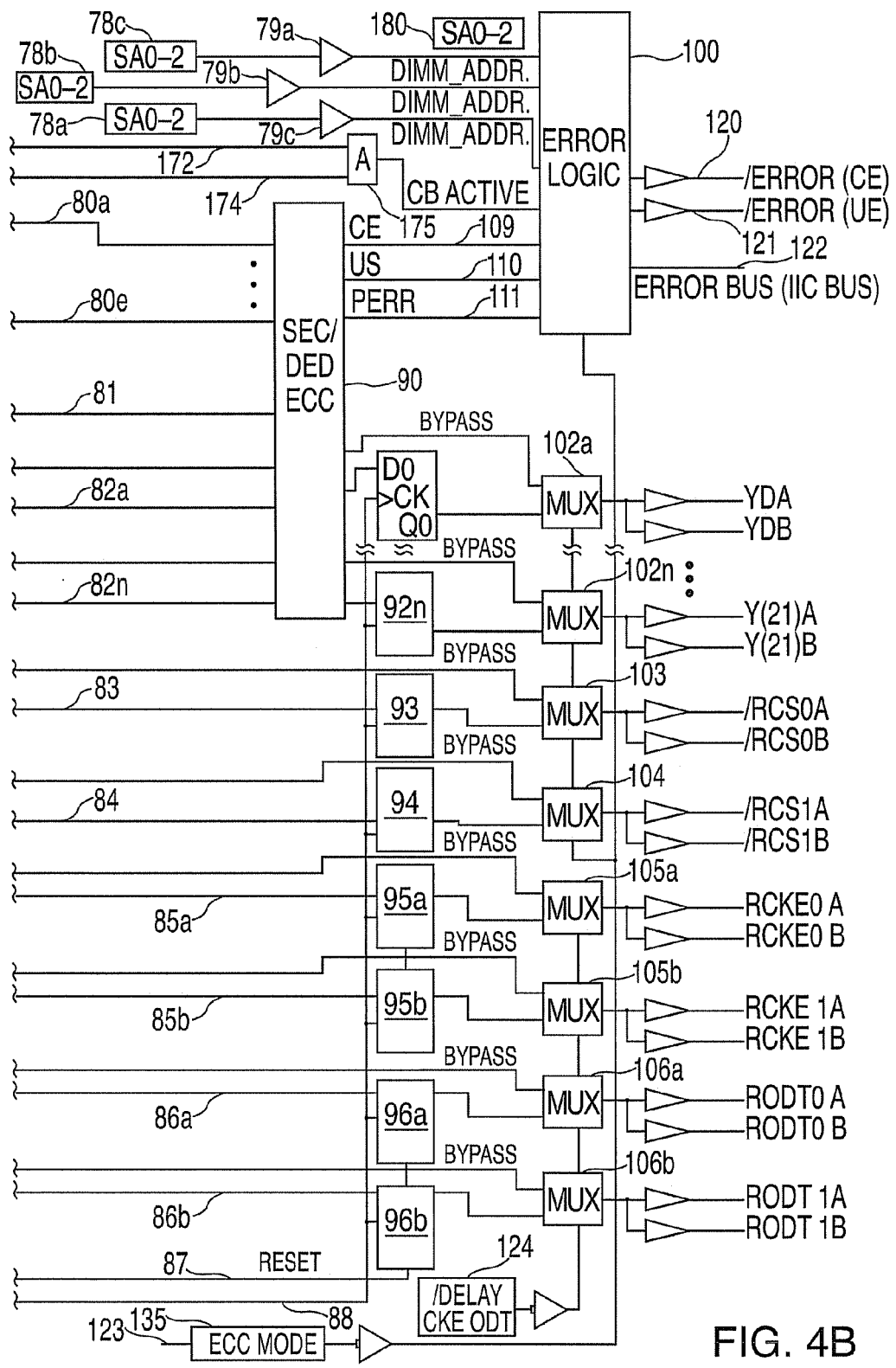
Figure 5:
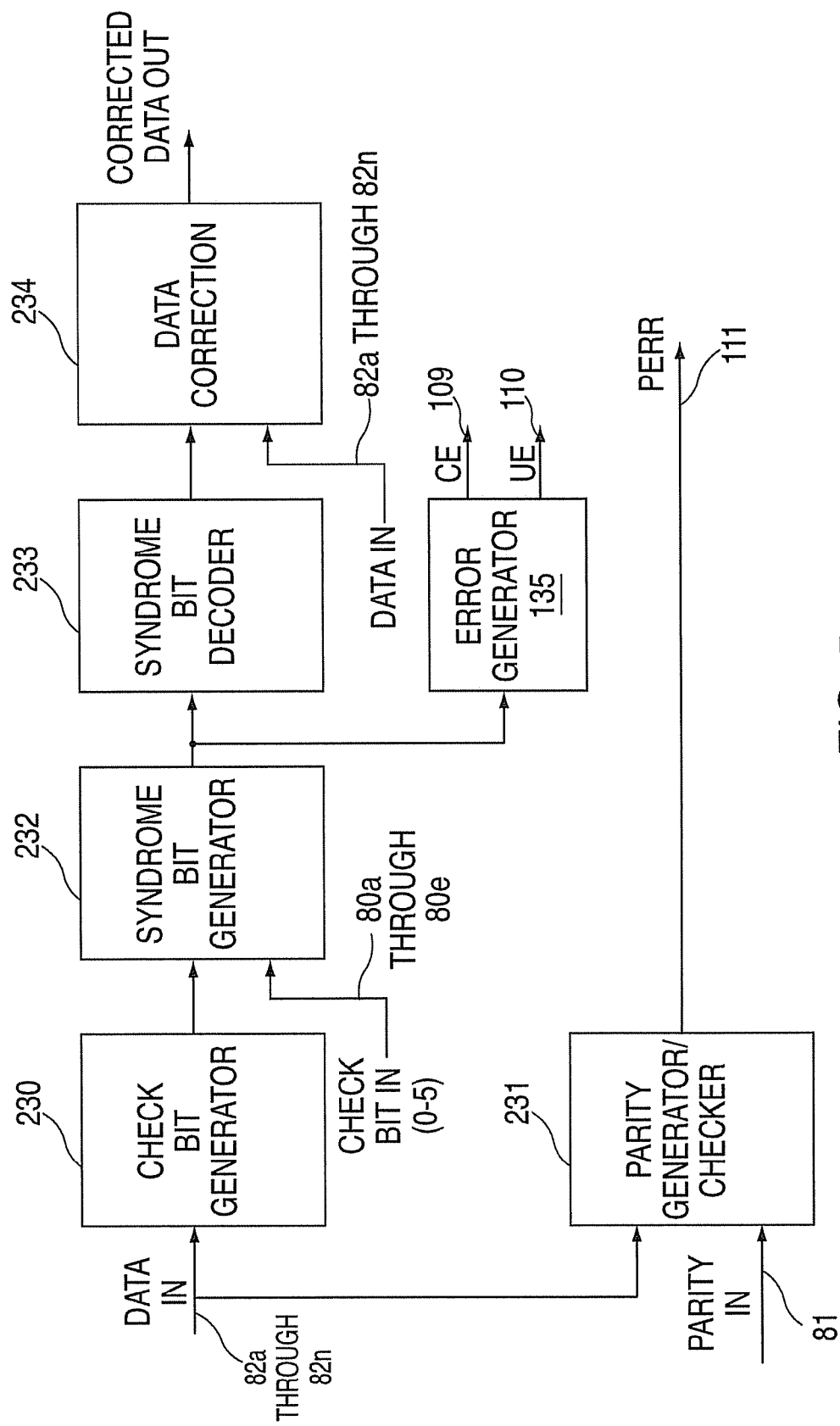
FIG. 5 is a block diagram of the single error correction/double error detection error correction code (SEC/DED ECC) circuit of FIG. 4B.
Figure 8:
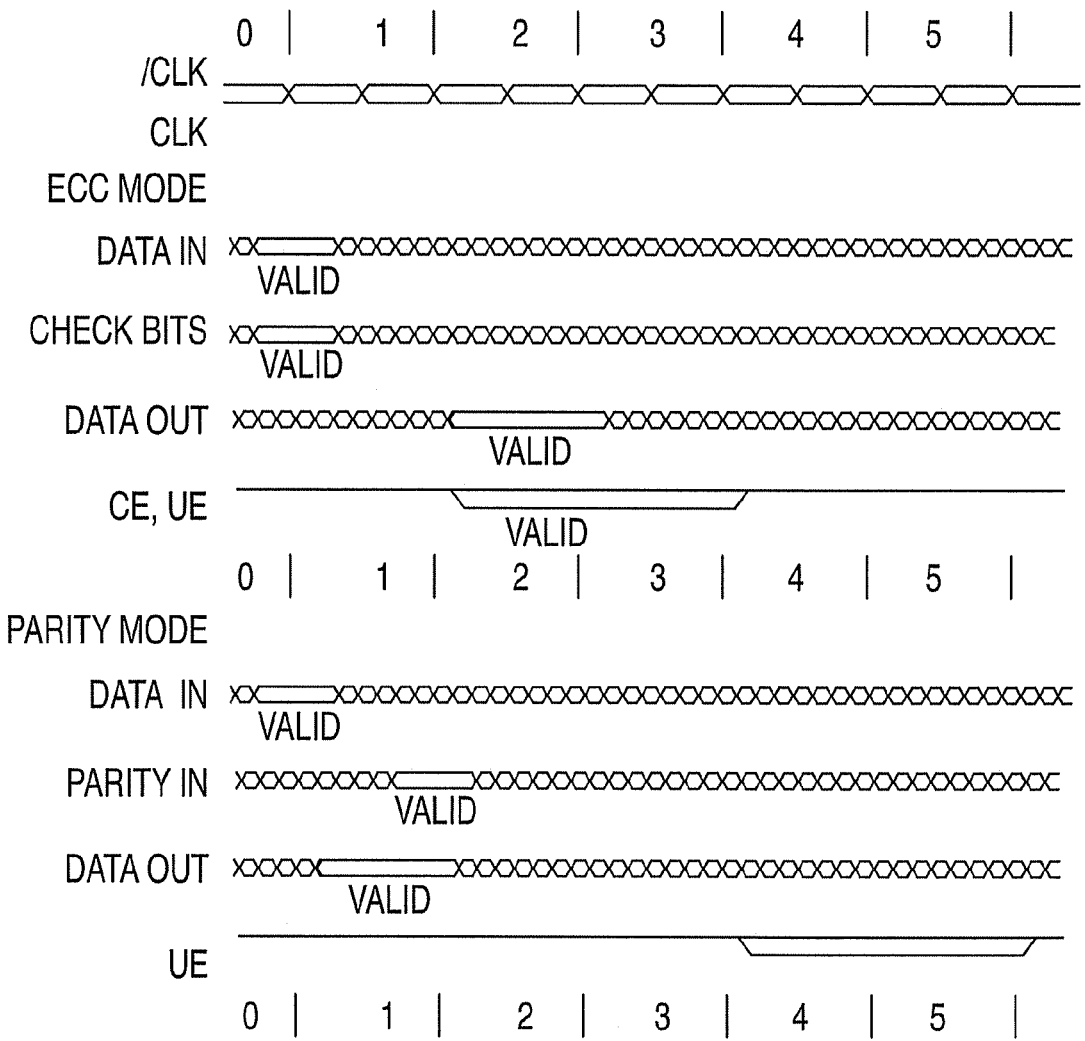
FIG. 8 shows the timing diagram used with the present invention.
Figure 9:
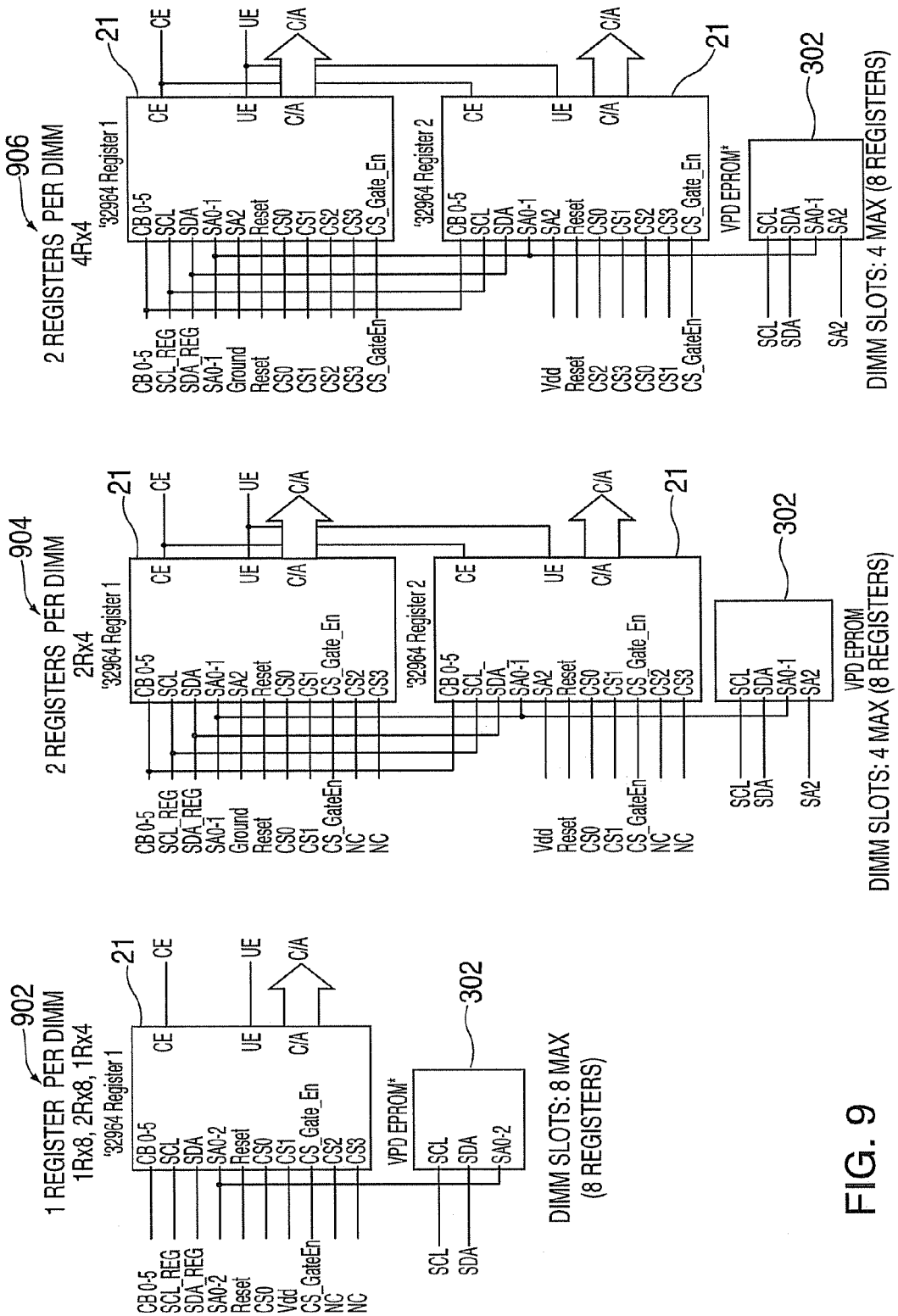
FIG. 9 shows the buffer connections and total number of buffers used in a system when the buffer of the present invention is used on 1, 2 and 4 rank DIMMs.
Figure 10:
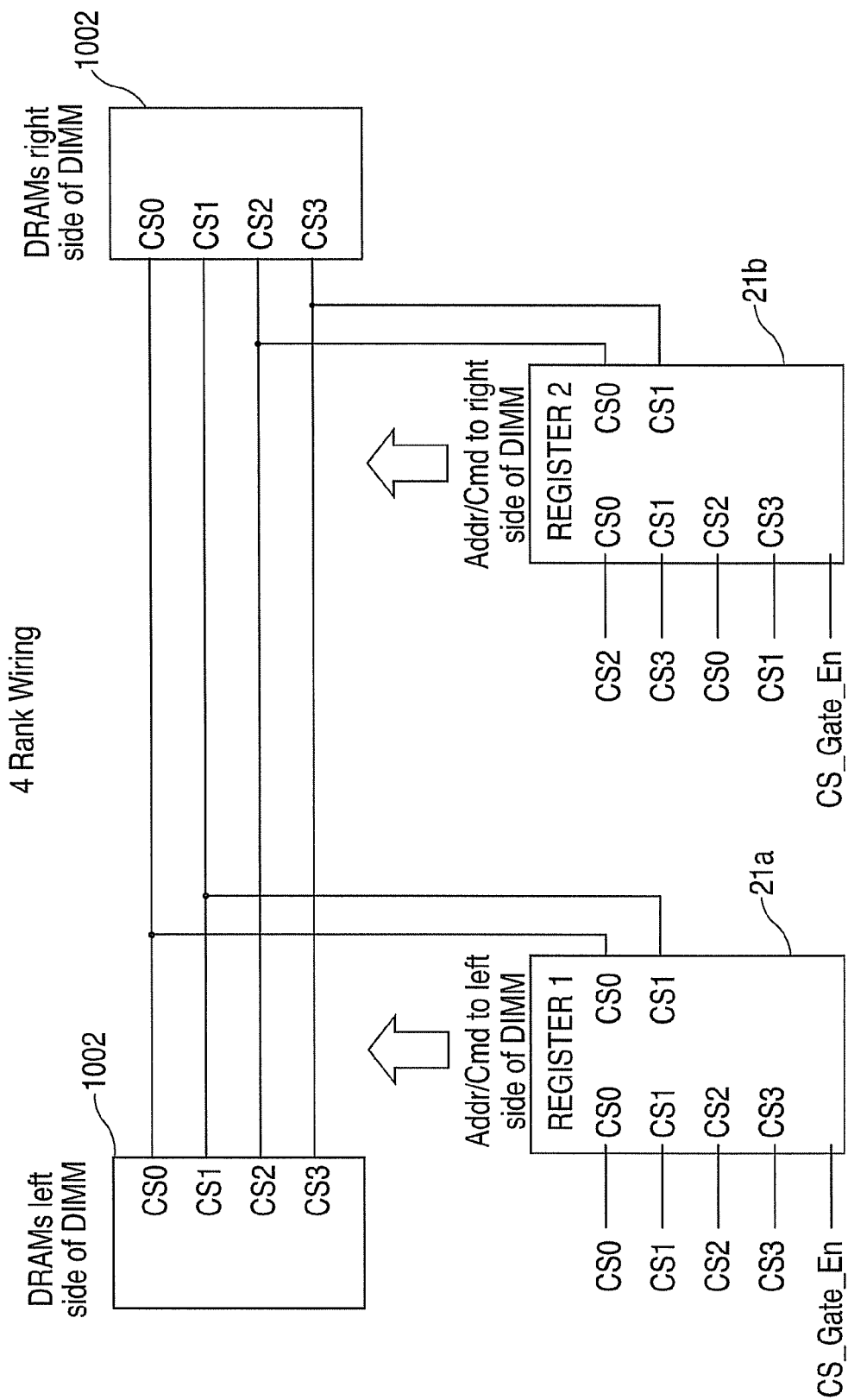
FIG. 10 shows the CS wiring between the buffers and the memory devices on the right and left side of the card, for a 4 rank DIMM of the present invention.

A full appreciation of the features and advantages of the present invention can best be gained by reference to the drawings and more particularly to the figures where: FIG. 1 is a block diagram of a typical server memory arrangement; FIG. 2 is a block diagram of the enhanced server memory arrangement of the present invention; FIGS. 3A and 3B are plan views respectively of the front and back of a 4 rank planar 276 contact dual inline memory module (DIMM) of the present invention; FIGS. 3C and 3D are plan views respectively of the front and back of a 4 rank four high stacked 276 contact DIMM of the present invention; FIGS. 4A and 4B are schematic views of the 4 rank-optimized buffer/register, parity and error correction circuits shown in FIGS. 3A and 3B (and FIGS. 3C and 3D); FIG. 5 is a block diagram of the single error correction/double error detection error correction code (SEC/DED ECC) circuit of FIG. 4B; FIG. 6 describes, in H—matrix, form the preferred ECC code selected for the module of FIGS. 3A and 3C; FIGS. 7A, 7B and 7C show the designated pin connections for the DIMM of FIGS. 3A and 3B (and FIGS. 3C and 3D). FIG. 8 shows the timing diagram used with the present invention. FIG. 9 shows the buffer connections and total number of buffers used in a system when the buffer of the present invention is used on 1, 2 and 4 rank DIMMs; FIG. 10 shows the CS wiring between the buffers and the memory devices on the right and left side of the card, for a 4 rank DIMM of the present invention and FIG. 11 is a table showing the IIC addresses that would be used to access the error registers on the one or two buffers of the present invention.

In FIG. 1 there is illustrated, in schematic form, a block diagram of a typical server memory arrangement as might be found in any currently available server which can employ a plurality of memory subsystems, shown here in the form of dual inline memory modules (DIMMs). It should be understood that many such DIMMs would be used in actual practice but for ease of illustration only one prior art DIMM 10 is shown in FIG. 1. DIMM 10 is a printed circuit card on which there is provided a plurality of either synchronous dynamic random access memories or dynamic random access memories circuits 11, herein after collectively referred to herein as memory devices, or as DRAM(s). Each DRAM 11 on the DIMM 10 has a plurality of input/output pins that are coupled, via the printed circuitry on the DIMM 10 to the contacts on the DIMM 10 and theses contacts are further coupled, via a data line 15, to a memory interface chip 18 and to a memory controller or processor 19. Each DRAM on the DIMM is further, coupled via such DIMM contacts, to a buffer/register 12 and to a phase locked loop circuit 14 on the DIMM. The phase locked loop 14 (PLL) is connected via clock line 17 to the memory interface chip 18. The register 12 is also coupled to the memory interface chip 18 via an address and command (CMD) bus 16. The memory interface chip 18 is coupled to the memory controller 19 via the data line 15, address and command line 16 and clock line 17. It should be understood that although only one such DIMM is shown in this figure that in actuality the server would contain many such DIMMs. Such other DIMMs would be coupled in a like manner to the memory interface chip 18 and memory controller 19 via data, address and command lines, and may be connected in a multi-drop, cascade interconnect or other connection method, depending on the system structure and buffer functionality. Since such servers and their operation are well known to those skilled in the art, further description of such servers and their operation is not deemed necessary.

Turning now to FIGS. 2, 3A, 3B, 3C, 3D, 4A, 4B, 5, 8, 9, 10 and 11 the enhanced server memory arrangement of the present invention will be described.

In FIG. 2 there is illustrated, in schematic form, a block diagram of a server memory arrangement employing the present invention. In this FIG. 2 the server comprises a novel DIMM 20 provided with a novel ECC/Parity Buffer chip 21 (also referred to as a "buffer device") coupled to the memory interface chip 18 which is in turn coupled to the memory controller or processor 19. It should be understood that the chip 21 need not include both the ECC function and the parity function. For example, the chip 21 could have just the 4 rank addressability alone, the ECC function alone or just the parity function alone and still operate in accordance with the present invention. More specifically, as shown in this FIG. 2, the memory interface chip 18 sends and receives data from the DIMMs via the data line 15 and sends address and commands via line 16. The memory interface chip 18 then sends and receives data, via line 15, to the memory devices, or DRAMs 22 and sends address and command information to the register chip 21 via add/cmd line 16 and check bits for error correction purposes to the ECC/Parity register chip 21 via line 25. In this configuration, the check bits and/or parity bits associated with the ECC/Parity register chip 21 are developed in the memory interface chip 18, although in other embodiments these bits could be developed in the memory controller or processor 19, be communicated to the memory interface chip as a subset of the information on line 16 and the memory interface would then re-drive this information to the memory module on line 25.

FIGS. 3A and 3B show respectively the front and back views of the novel 4 rank DIMM 20 of the present invention. Generally speaking DIMMs are printed circuit cards designed to carry a plurality of DRAMs 22 thereon and the DRAM output pins (not shown) are connected via the printed circuit to selected connectors 23 along the edge of both the back and front sides of the card and are often provided with a single indexing key or notch 9 on the connector edge. The use and manufacture of such DIMMs is well known and need not be further described herein. The DIMM 20 of the present invention however is novel and is designed to address the need for very high memory module density, as well as several of the most significant contributors to unplanned and often catastrophic system outages encountered in the prior art DIMMs. The improvements in the DIMM 20 of the present invention are realized especially by enlarging the length of DIMM 20 to between 149 mm and 153 mm. Nominally the DIMM 20 is 151.35 mm (5.97 inches) long and its width is 54.6 mm (2.16 inches). The width of the DIMM 20 is sufficient in width to accommodate the four rows of DRAMs 22 installed thereon, in addition to the two buffers 21 (one buffer is mounted on each side in the exemplary embodiment, as shown in FIGS. 3A and 3B), the PLL 24 and passive devices (not shown) such as resistors and capacitors, but must also be no wider than permitted by the available system physical dimensions for the module(s). The length of the DIMM 20 however must be such that the DIMM 20 can accommodate additional signal contacts, up to 138, as well as up to thirty-six planar DRAMs 26 having a nominal body size of up to 11.5 mm wide by 11 mm tall and have a locating key or notch 9 a distance of between 82.675 mm from one end of the DIMM 20 and 68.675 mm from the other end of the DIMM as shown. Again it should be understood that these dimensions are nominal and may vary plus or minus 3 mm in various implementations. The DIMM 20 can also be provided with additional notches 9a and 9b on each side, i.e., the shorter edges of the DIMM 20. These dimensions permit the DIMM, of the invention, to accommodate placing up to thirty-six planar DRAMs 22 on the front surface and up to an additional thirty-six such DRAMs 22 on the rear surface. Further, as shown in FIG. 3A, on the front of each DIMM 20, in addition to the DRAMs, there is positioned a phase locked loop (PLL) chip 24 and the novel ECC/Parity Buffer chip 21 of the present invention. This novel ECC/Parity Buffer chip 21 will be further described below and in detail in conjunction with FIGS. 4A and 4B It should be understood that the PLL chip 24 can be eliminated if its circuitry is provided on the buffer chip 21 or within the same package as the buffer chip 21 (i.e. alongside the chip, above the chip, below the chip, etc). In exemplary embodiments, the DIMM 20 depicted in FIGS. 3A and 3B also includes an EPROM 302 which is used for the storage of memory module attribute information (commonly referred to as an SPD data, when associated with memory modules), with the EPROM's IIC interface also shared, in this module, with the novel ECC/Parity Buffer chip, enabling one means for accessing status registers on the buffer chip(s).

Alternate configurations of the 4 rank DIMM 20 may be implemented by exemplary embodiments. See, for examples FIGS. 3C and 3D which depict front and back plan views of a 4 rank four high stacked 276 contact DIMM 20 of the present invention. In the embodiment depicted in FIG. 3D, the DIMM 20 also includes an EPROM device 302 which has the same function as device 302 in FIG. 3A, which includes enabling one means for accessing status registers on the buffer chip(s). As will be evident to those skilled in the art, other configurations for providing up to 4 ranks of memory may also be implemented without departing from the scope of the invention. For example, a 4 rank two high, stacked 276 contact DIMM 20 may be implemented by exemplary embodiments.

This new, improved, larger sized DIMM 20, shown in these FIGS. 3A, 3B, 3C and 3D also achieves a further significant improvement in the interconnect failure rate for the larger size of the module permits the connector system to accommodate two hundred and seventy-six contacts or pins 23. These pins are numbered and coupled to respective inputs as shown in FIGS. 7a, 7b, and 7c. Contact or pin number one (1) is identified and shown in FIG. 3A as contact 23A and is on the left hand side of the front side of the DIMM 20 and is positioned approximately 5.175 mm from the left edge of the DIMM 20 and 77.5 mm from the center of the notch 9. Contact or pin number one hundred and thirty-eight (138) is identified and shown in FIG. 3A as contact 23B and is on the right hand side of the front side of the DIMM 20 and is positioned approximately 5.175 mm from the right edge of the DIMM 20 and approximately 63.5 mm from the center of the notch 9. Contact or pin number one hundred and thirty-nine (139) is identified and shown in FIG. 3B as contact 23C and is directly opposite contact number one 23A and is also positioned approximately 5.175 mm from the right edge of the back of DIMM 20 and is also 77.5 mm from the center of the notch 9. Contact or pin number two hundred and seventy-six (276) is identified in shown in FIG. 3B as contact 23D and is directly opposite contact number one hundred and thirty-eight 23B and is also positioned approximately 5.175 mm from the left edge of the back of DIMM 20 and 63.5 mm from the center of the notch 9. The greater size of this DIMM 20 also accommodates the inclusion of a new and larger ECC/Parity buffer chip 21 required by the present invention. Because the two hundred and seventy-six contacts or pins 23 on this larger DIMM 20 are more than sufficient to meet the needs of all the circuitry on the DIMM 20 this means that the DIMM 20 provides extra or redundant contacts. These extra or redundant contacts or pins 23 can now be used to provide additional protection for certain selected signal or voltage lines, for which error correction is not possible. The present invention, by providing such redundant contacts, effectively eliminates concerns such as contact failures on clock inputs, CS, CKE, and ODT inputs, Vref inputs, and other signals not protected by ECC. Other benefits include the elimination or reduction of concerns regarding power supply noise and/or voltage drops due to scarcity of voltage (VDD) contacts in the data region as well providing additional ground pins in the address/ control region on the DIMM 20. The larger contact count of the present invention also permits the DIMM 20 to be wired such that they are consistent with prior art DIMMs. The additional contacts 23 also permit the inclusion of ECC check bits, associated with address and command inputs, allowing for real-time system monitoring of faults associated with these inputs, as well as system interrogation of fault counts and attributes. These faults would result in catastrophic system outages in conventional prior art systems using the smaller prior art DIMMs.

It should be understood that although only one DIMM 10 and 20 is shown in the FIGS. 1 and 2 that, in actuality, the server would contain many such DIMMs. As noted above, the DIMM 20, of the present invention, is provided with a plurality of SDRAMs 22, a phase locked loop circuit 24 and the ECC/Parity buffer chips 21. The ECC/Parity buffer chips 21 on DIMM 20 include unique error correction code (ECC) circuitry that is coupled to the memory interface chip 18 via line 25 to provide even greater significant reliability enhancement to such servers. The inclusion of this new, improved error correction code (ECC) circuitry results in a significant reduction in interconnect failure. Memory interface chip 18 connects to both of the ECC/Parity buffer chips 21 through lines 25 and 16 and to PLL 24 through line (17). In exemplary embodiments, such as the one depicted in FIGS. 3A and 3B, one copy of the address and command outputs from buffer chip 21 located on the front of the DIMM 20 connect to the 20 (S)DRAMs to the left of the buffer chip 21 (10 DRAMs on the front and 10 DRAMs located behind said 10 DRAMs on the back of the DIMM), and the second copy connect to the 16 DRAMs to the right of the buffer (8 DRAMs on the front and 8 DRAMs located behind said 8 DRAMs on the back of the DIMM). The buffer chip 21 located on the back of the DIMM is wired in a similar manner, with one copy of the address and command outputs from the buffer connected to 20 DRAMs (10 on the front and 10 on the back) and a second copy connected to 16 DRAMs (8 on the front and 8 on the back). In exemplary embodiments, such as the one depicted in FIGS. 3C and 3D, one copy of the address and command outputs from buffer chip 21 located on the front of the DIMM 20 connect to the 20 DRAMs to the left of the buffer (2 DRAM stacks on the front and 3 DRAM stacks generally located behind said 2 DRAM stacks on the back of the DIMM), and the second copy connects to the 20 DRAMs to the left of the buffer (3 DRAM stacks on the front and to the right of the buffer and 2 DRAM stacks located generally behind said 3 DRAM stacks on the back of the DIMM). The buffer chip 21 located on the back of the DIMM is wired in a similar manner, with one copy of the address and command outputs from the buffer connected to 16 DRAMs to the right (2 DRAM stacks on the front and 2 DRAM stacks on the back) and a second copy connected to 16 DRAMs to the right (2 DRAM stacks on the front and 2 DRAM stacks on the back). PLL 24 connects to each of the SDRAMs 22.

In an exemplary embodiment, a first set of buffer chip outputs connect to the SDRAM devices placed directly to the right of a buffer chip 21 on the front side of the DIMM 20 and to the memory devices on the backside of the DIMM 20 and on the same end of the DIMM 20 as the aforementioned memory devices, and a second set of buffer outputs connect to the devices to the left of the buffer on the front side of the DIMM 20 and to the memory devices, or SDRAMS 22, on the backside of the DIMM 20 and on the same end of the DIMM 20 as these memory devices. Alternate exemplary wiring embodiments may be used, while achieving the benefits described herein. For example, in FIGS. 3A-3D, address and command outputs from buffer 21, located on the front of the DIMM, may wire only to (S)DRAMs located on the front of the DIMM, while address and command outputs from buffer 21, located on the back of the DIMM, may wire only to (S)DRAMs located on the back of the DIMM. Other wiring methods may be used for address and command, while achieving many of the objectives cited in the teachings.

FIGS. 4A and 4B together comprise a schematic view of the novel ECC/Parity buffer chip 21 on DIMM 20 where, for clarity in description, it is shown as comprised of two distinct sections 21a and 21b. FIG. 4A shows the input portion of the enhanced function 4 rank-enabled 28 bit 1:2 buffer/register segment 21a of the present invention and FIG. 4B shows the output portion and error correction code circuit segment 21b. As depicted in FIGS. 4A and 4B, the buffer chip (also referred to herein as the buffer device) includes a plurality of buffer circuits (e.g., receivers, multiplexers, latches, etc.) for driving the address and command data. The error correction code circuit ECC segment 21b, shown in FIG. 4B, corrects for single bit errors and thus permits continuous memory operation independent of the existence of these errors. This ECC segment also includes a parity operating mode circuitry together and error reporting circuitry. The novel ECC/Parity buffer 21 on DIMM 20 thus provides leading-edge performance and reliability and key operational features different from and unavailable from the prior art while retaining timing requirements generally consistent with devices such as the JEDEC 14 bit 1:2 DDR II register.

More particularly, the register segment 21a contains a plurality of so called differential bit receivers 40a through 40e, 41, 42a through 42n, 43a, 43b, 44a, 44b, 45a, 45b, 46a and 46b and a single amplifier 47. Each of these differential receivers 40a through 40e, 41, 42a through 42n, 43a, 43b, 44a, 44b, 45a, 45b, 46a and 46b has two inputs and a single output. One of the inputs of each differential receiver 40a through, 40e, 41, 42a through 42n, 43a, 43b, 44a, 44b, 45a, 45b, 46a and 46b is coupled to a reference voltage source 28. The second input of the each of the differential receivers 40a through, 40e, 41, 42a through 42n, 43a, 43b, 44a, 44b, 45a, 45b, 46a and 46b are coupled to respective inputs 30a through, 30e, 31, 32a through 32n, 33a, 33b, 33c, 33d, 34, 35a, 35b, 36a and 36b.

Receiver set 40a through 40e is comprised of five receivers of which only the first and the last receivers 40a and 40e are shown. Receivers 40a through 40e have their second inputs respectively coupled to respective check bit lines 30a through 30e and their outputs connected through respective primary multiplexers 60a through 60e to the inputs of respective primary latches 70a through 70e. Typically the check bit lines are contained in a bus that contains a set of five such check bit lines. However, for simplification of the drawing and ease of description only, FIG. 4A shows only the first and the last check bit lines 30a and 30e of the set and the first and last of the receivers 40a through 40e. It being understood that each receiver in the set 40a through 40e has one of its respective inputs coupled to a respective one of a set of check bit input lines 30a through 30e and its output to a respective one of a set of three input multiplexers and thence to a respective one of a set of three input primary latches.

The second input of the differential receiver 41 is coupled to a check bit 0/Parity_ in signal line 31.

Receiver set 42a through 42n is comprised of twenty-two receivers coupled to a data line bus typically containing twenty two data lines 32a through 32n. However, for simplification of the drawing and ease of description only, FIG. 4a shows only the first and the last data lines 32a and 32n of the set and the first and last of the receivers 42a through 42n are shown in the drawing. The first receiver 42a is shown as having its first input coupled to data bit line 32a and its output coupled to the first input of multiplexer 62a whose output is coupled to a first input of primary latch 72a and the last receiver 42n is shown as having its first input coupled to data bit line 32n and its output coupled to the first input of multiplexer 62n whose output is coupled to a first input of primary latch 72n. Each respective receiver in set 42a through 42n has an input coupled to a respective one of data lines in set 32a through 32n and their outputs connected through respective primary multiplexers 42a through 42n to the inputs of respective primary latches 62a through 62n. All the primary multiplexers and latches in the set 42a through 42n are identical to those shown connected to receivers 42a and 42n. Thus each receiver in the set has one of its respective inputs coupled to a respective one of a set of data bit input lines and its output to a respective one of a set of two input multiplexers and thence to a respective one of a set of primary latches. These signals are inputted from the memory interface chip 18 in FIG. 2 and are re-driven only when one or more of the inputs 33a, 33b, or 34 are low.

As previously noted, the second input of the differential receiver 41 is coupled to a check bit 0/Parity_ in signal line 31. The output of the differential receiver 41 is coupled to an input of multiplexer 61 whose output is coupled to a primary latch 71. The check bit 0/Parity_ in signal is interpreted as an ECC check bit from the memory controller or as a parity bit depending on the setting of ECC mode input 136 (FIG. 4B) Clock inputs 131 are fed to all the primary latches 70a through 70e, 71, 72a through 72n, 73, 74, 75a, 75b, 76a and 76b. The Check bits 1-5 at inputs 30a through 30e are in a don't care state when the register is being operated in parity mode and will be held low. When these inputs are operated in parity mode, a parity in signal will be provided on the Check bit 0/Parity_ in signal line 31 and maintain odd parity across the data inputs 32a through 32n, at the rising edge of the clock signal (CK) at input 131 that immediately follows the rising edge of clock 131 that occurred simultaneously with the associated data inputs 32a through 32n.

The second inputs of the differential receivers 43a, 43b, 44a and 44b are respectively coupled to chip select lines /CS0, /CS2, /CS1 and /CS3 and the outputs of the differential receivers 43a and 44a are coupled respectively to the first inputs of primary latches 73 and 74 as well as to the first and third inputs of a five input select NAND gate 63, while the outputs of the differential receivers 43b and 44b are coupled only to the second and fourth inputs of the five input select NAND gate 63. The output of NAND gate 63 is coupled to the selection input of the multiplexers 60a through 60e, 61 and 62a through 62n. These lines initiate DRAM address/command decodes and as such at least one will be low when a valid address/command signal is present and the register can be programmed to re-drive all the data inputs when at least one chip select input (/CS0, /CS1, /CS2, /CS3) 33a, 33b, 33c, 33d is low. The fifth input of this NAND gate 63 is coupled to CS gate enable circuit 34 which can be set low to cause multiplexers 60a through 60e to pass signals from receivers 32a through 32n independent of the levels on inputs 33a, 33b, 33c and 33d.

The output of differential receivers 43a and 44a are also respectively coupled through the lines 172 and 174 and the AND gate 175 (FIG. 4B) whose output is coupled to the error logic circuit 100 also shown in FIG. 4b.

Receiver 45a has an input coupled to the clock enable signal source 35a (CKE0) and an output coupled to the primary latch 75a.

Receiver 45b has an input coupled to the clock enable signal sources 35b (CKE1) and an output coupled to the primary latch 75b.

Receiver 46a has an input coupled to the on die termination line signal input line 36a (ODT0) and an output coupled to the primary latch 76a.

Receiver 46b has an input coupled to the on die termination line signal line 36b (ODT1) and an output coupled to the primary latch 76b.

Receiver 47 has an input coupled to the reset (/RST) signal line 37. The inputs 35a and 35b (CKE0, CKE1) 36a and 36ba (ODT0, ODT1) are provided from the memory interface chip 18 and are not associated with the Chip Select (CS) inputs 33a, 33b, 33c and 33d, and the signal from source 37 (/RST) driving amplifier 47 is an asynchronous reset input and, when low, resets all the primary latches 70a through 70e, 71, 72a through 72n, 73, 74, 75a, 75b, 76a, 76b and all the secondary latches 92a through 92n, 93, 94, 95a, 95b, 96a and 96b thereby forcing the outputs low. This signal from source 37 (/RST) also resets the error bus registers and error lines from the error logic circuit 100.

Coupled to the above described register of FIG. 4A is the unique error correction code circuit arrangement of FIG. 4B.

In FIG. 4B, module location identification is provided to error logic circuit 100 which is more fully described in conjunction with FIG. 6 below. This module location identification is provided to error logic circuit 100 through receivers 79a, 79b, and 79c whose inputs are coupled to DIMM address input range sources (SA0, SA1, SA2) 78a, 78b and 78c and whose outputs are coupled to an error logic circuit 100. The signals from sources (SA0, SA1, SA2) 78a, 78b and 78c define the DIMM address which is then reported on the error bus when requested by the system. This error logic circuit 100 is controlled by a signal from the NAND gate 175 when either of the DRAM chip select signal sources (/CS0) 33a and (/CS1) 33b are active. The error logic circuit 100 further has a reset signal source 180 coupled thereto.

Also included in the error correction code circuit of FIG. 4B is a SEC/DED ECC circuit 90 which is more fully described in conjunction with FIG. 5 below. Coupled to this SEC/DED ECC circuit are the outputs of primary latches 70a through 70e, 71 and 72a through 72n. This SEC/DED ECC circuit 90 provides three outputs 109, 110, and 111 to the error logic circuit 100. These outputs are: a correctable error (CE) line 109, an uncorrectable error (UE) line 110 and a parity error bit line 111 fed to the error logic circuit 100 which provides outputs regarding correctable and uncorrectable errors on output lines 120 and 121. When either error line (CE) 109 or uncorrectable error line (UE) 110 is low this indicates that an error was identified as being associated with the address and/or command inputs (either correctable or uncorrectable). The error lines 120,121 will be active, i.e., low, for two clock cycles simultaneous with the re-driven address/command data when operating in ECC mode or delayed by two clock cycles when operating in parity mode. The logic error circuit 100 also provides an Error Bus (Inter Integrated Circuit or IIC) 122 for external collection of error information such as error type, DIMM address, error count and status of the 28 input and internally generated syndrome bits at the time of the first fail. The information remains latched until a reset command is written to bus 122 or /RST input 37 is switched low. The selected IIC protocol allows unique byte addressing of the ten registers, consistent with the present industry standard protocol for serial program decode electronic erasable programmable read only memory (SPD EPROM) and is well known to the art.

This SEC/DED ECC circuit 90 also has data bit outputs coupled through secondary latches 92a through 92n to a first input of all the output or secondary multiplexers 102a through 102n. The output of register latches 72a through 72n labeled BYPASS are directly connected to the second input of the output or secondary multiplexers 102a through 102n thereby allowing the SEC/DED ECC circuit 90 to be bypassed depending on the ECC mode input 123.

The output of the primary or register latches 73, 74, 75a, 75b, 76a and 76b are all coupled to a first input of secondary or output latches 93, 94, 95a, 95b, 96a and 96b and through these secondary latches 93, 94, 95a, 95b, 96a and 96b to a first input of output or secondary multiplexers 103, 104, 105a, 105b, 106a and 106b. The outputs of primary latches 73, 74, 75a, 75b, 76a and 76b are connected directly to a second input of output or secondary multiplexers 103, 104, 105a, 105b, 106a and 106b thereby allowing secondary latches 93, 94, 95a, 95b, 96a and 96b to be bypassed based on the /Delay CKE input 124 and /ECC mode input 123.

A control circuit comprised of a differential register 130 that has a first input coupled to a CK signal input 131, a second input coupled to a /CK signal input 132 and its output coupled to a second input all the primary latches 70a through 70e, 71, 72a through 72n, 73, 74, 75a, 75b, 76a and 76b and to the second input of all the output or secondary latches 92a through 92n, 93, 94, 95a, 95b, 96a and 96b and to the error logic circuit 100 via line 88. The /ECC mode signal source 135 is coupled to a selection third input of secondary multiplexers 102a through 102n, 103 and 104 and to the error logic circuit 100. The output or secondary multiplexers 105a, 105b, 106a and 106b have their selection inputs coupled to a source 124 of /Delay, CKE_ODT signals.

The ECC code selected for this module is a single error correction/double error detection (SEC/DED) code and is shown in the H-Matrix depicted in FIG. 6. The use of this SEC/DED code ensures that all single errors associated with the address and command bits are detected and corrected and that all double bit errors are detected. It should be noted that interconnect failures almost exclusively begin as single point fails, with other failures possibly occurring over time dependent or independent of the root cause of the initial fail.

In summary, the present invention describes a unique DIMM having an enhanced 4 rank-enabled 28 bit 1:2 register with added error correction code logic (ECC) incorporated therein for correcting single bit errors while permitting continuous memory operation independent of the existence of these errors. A parity operating mode is also provided, in conjunction with error reporting circuitry to permit the system to interrogate the device to determine the error condition.

The above described 28 bit 1:2 register of the present invention provides key operational features, which differ from existing register designs intended for memory module applications and includes: 4 rank operability, disabling of un-needed internal circuitry when the module is not selected, error detection and correction on key inputs; programmable delay for un-gated inputs; parity mode; reset circuitry; error reporting and identification and reporting of the DIMM address.

CS gating of key inputs, e.g., /CS0, /CS1, /CS2 and /CS3, is provided as a means of reducing device power for the internal latches which will only be updated and related internal circuitry utilized when one, two, three or all of the chip select CS) inputs are active low (and chip select gate enable tied high) at the rising edge of the system clock. The twenty-two chip select-gated signals associated with this function include addresses continuously re-driven at the rising edge of every clock depending on the state of chip select. However, the chip select gating function can be disabled by tying the chip select gate enable input low thereby enabling all internal latches to be updated on every rising edge of clock.

In exemplary embodiments, the 4 rank circuitry in the enhanced 4-rank enabled ECC/parity buffer chip 21 is designed such that the enhanced 4-rank buffer device/chip 21 can be utilized as a direct replacement for earlier 2-rank enabled buffers, on one and two rank DIMMs, with no changes to the wiring of the assembly originally designed to use the earlier device. The inputs to differential receivers 43b and 44b are designed to float to a high level when not connected to an input source, the register pins assigned to inputs /CS2 33c and /CS3 33d were previously assigned to redundant VDD pins, and novel wiring on the 4 rank memory module depicted in FIGS. 3A-3D permit two of these buffers to be used on the 4-rank memory modules as shown in subsequent figures.

Programmable delay for un-gated inputs (/Delay CKE-ODT) associated with CKE and ODT (DRAM signals), the inputs will be latched and re-driven on each rising edge of the clock signal (CLK,) independent of the state of the chip select (CS) signals. However, since some controllers may be designed with limited flexibility regarding latency for these signals vs. chip select (CS), address (Addr), row address strobe (RAS), column address strobe (CAS) and write enable (WE), a delay block can be selected to re-align the timing relationships which are offset by 1 clock when the error correction code circuitry (ECC) is enabled.

ECC Mode (/ECC Mode low): For all inputs gated by CS, on-chip SEC/DED ECC logic is enabled and the signal received on CHK0/Parity in is received as check bit 0 when /ECC Mode input is low. This ECC logic will operate across 28 inputs (22 'CS-gated inputs and the 6 check bits) and will correct all single bit errors and detect all double bit errors present on the twenty-two chip select gated data inputs. If a correctable error is detected, /Error (CE) will be driven low for two clocks and errors will be counted and latched in the error bus registers for the 28 inputs if this is the first error since a reset is issued. Any double bit error will also be detected (as well as many other errors that are not correctable), and will be reported on the /Error (UE) error line (driven low for two clocks) and in the error bus registers if this error is the first since a Reset is issued. Although /CS0, /CS1, /CS2 and /CS3 are not included in the ECC logic, the propagation delay of the CS output signals will track the signals included in the ECC logic (1 additional clock of latency).

In addition to the above ECC mode, the same twenty two chip select gated data signals can be operated in 'parity mode (/ECC Mode high), whereby the signal received on CHK0/Parity in line is received as parity to the register one clock pulse later than the chip select gated data inputs. The received parity bit is then compared to the parity calculated across these same inputs by the register parity logic to verify that the information has not been corrupted. The twenty two chip select gated data signals will be latched and re-driven on the first clock pulse and any error will be reported two clock pulses later via the Uncorrectable Error (UE) line (driven low for two clock pulses) and in the Error Bus Registers. No correction of errors will be completed in this mode. The convention of parity, in this application, is odd parity (odd numbers of 1s across data and parity inputs equals valid parity).

The /RST signal input is used to clear all internal latches (including the error registers), and all outputs will be driven low quickly except the error lines which will be driven high.

Error reporting circuitry is included to permit external monitoring of DIMM operation. Two open-drain outputs are available to permit multiple modules to share a common signal line for reporting an error that occurred during a valid command (/CS=low) cycle (consistent with the re-driven signals). These two outputs are driven low for two clocks to allow the memory controller time to sense the error. /Error (CE) indicates that a correctable error occurred and was corrected by the ECC logic, /Error (UE) indicates that an uncorrectable error occurred and depending on the mode selected is an uncorrectable ECC error or a parity error. Note that the timing of /Error (UE) is different in parity mode vs. ECC mode.

In addition, an error bus (enabling access to 10 registers that can be read and reset via an IIC bus) is available to permit the device to be interrogated for additional error information, such as the error type (correctable, uncorrectable or parity error), error count and the memory card location (via the SA0-2 address pins which are conventionally wired only to the separate serial program decode (SPD) electronic erasable programmable read only memory (EE PROM). Other information is also available for diagnostics such as the signals received by the register (address/command, control signals, check bits, parity bit) when a chip select (CS) is active low and the associated syndrome bits so that they can be decoded to determine which of the 28 input signals (22 'CS-gated plus 6 check bits) or internal ECC logic failed, as well as an indication of the buffer type (1 to 2 rank enabled buffer or 1 to 4 rank enabled buffer), the buffer die revision, an indication of the buffer vendor, the maximum buffer speed, the driver strength and whether ECC has been bypassed by the application or not. These registers will contain information about the first fail, and the error counter will continue to increment until it is reset or reaches the full count (64K). All registers can be reset by writing the reset error bus command on the IIC bus, or via the /RST pin.

In addition to the use of the ECC structure defined above (included in both the memory interface chip and the register on the DIMM), redundant contacts are included on the module pinout to effectively eliminate other possible SPOF (single-point-of-failure) contributors in the interconnect system. Contacts that cannot be protected by the ECC structure described above, for various reasons, include the following: voltage reference (Vref), Clocks, Chip Selects (CS), CKEs, ODTs, VSS /VDD contacts or pins, Error lines, data input on the IIC bus (SDA), data clock on the IIC bus (SCL) and related signals. In the present invention each of these contacts is provided with a first contact on a first side of the DIMM and a redundant contact directly opposite the first contact and/or offset by no more than two pins from the first contact on the opposite side of the DIMM. For example if the voltage reference source 28 is applied via contact or pin 1 on the front side of the DIMM it is also applied via contact or pin 139 on the back side of the DIMM with contact 1 being direct opposite contact 139. Similarly the SDA signal is applied via contact or pin 135 on the front side of the DIMM and also via the contact or pin 273 on the back side of the DIMM and the /CS3 signal is applied via contact or pin 89 on the front side of the DIMM and also via contact or pin 225 on the back side of the DIMM. A full description of the contact or pin assignment matrix for the present invention is shown in FIGS. 7A, 7B and 7C. The specific contact placement is selected to maximize fault tolerance. By providing such opposite redundant contacts, problems caused, for example, by a slight bowing of the DIMM will cause low contact pressure on a contact on one side of DIMM but high pressure on the opposing contact. In such cases good signal flow will always be assured when such redundant and opposing contacts, as discussed above, are used. These opposing and redundant contacts will also facilitate board wiring by minimizing wiring congestion for this solution also permits in-line wiring. The following chart is a listing of the DIMM locations of a few of these contacts.

| Signal | Contact or PIN# | Side of DIMM | Nominal Distance from Key | Direction from Key |
| --- | --- | --- | --- | --- |
| CS0 | 86 | FRONT | 11.495 mm | RIGHT |
| CS0 | 224 | BACK | 11.495 mm | LEFT |
| CS1 | 91 | FRONT | 16.495 mm | RIGHT |
| CS1 | 229 | BACK | 16.495 mm | LEFT |
| CKE0 | 65 | FRONT | 13.505 MM | LEFT |
| CKE0 | 203 | BACK | 13.505 mm | RIGHT |
| CKE1 | 62 | FRONT | 16.505 mm | LEFT |
| CKE1 | 200 | BACK | 16.505 mm | RIGHT |
| RAS | 222 | BACK | 9.495 mm | LEFT |

-continued

| Signal | Contact or PIN# | Side of DIMM | Nominal Distance from Key | Direction from Key |
|---|---|---|---|---|
| CAS | 87 | FRONT | 12.495 mm | RIGHT |
| WE | 84 | FRONT | 9.495 mm | RIGHT |
| CK0 | 77 | FRONT | 2.495 mm | RIGHT |
| CK0 | 215 | BACK | 2.495 mm | LEFT |
| CK0B | 78 | FRONT | 3.495 mm | RIGHT |
| CK0B | 216 | BACK | 3.495 mm | LEFT |

The ECC function adds a single clock pulse delay (at planned operating frequencies) to the DIMM register performance, which may be of concern to some performance-optimized applications. As such, two additional modes are included on the module that permit the system user to tradeoff performance and reliability. In Parity Mode, the memory interface chip or controller would generate a single parity bit in conjunction with providing the full address and command field to the module. The module would re-drive the address and command bits, to the DRAMs, in the next cycle—rather than adding the additional cycle required in ECC mode. Any error on the address and command bus would be reported to the system at a later time, and the potential for recovery from the fail would be small hence this option is undesirable for many applications. The last mode would be to simply operate the memory in a mode with no parity bits and no ECC bits, with neither the added delay due to ECC nor any means to detect a fault on the address/command bus as per the prior art convention now used for these modules.

FIG. 5 is a block diagram of the SEC/DED ECC circuit of FIG. 4B. The twenty-two data inputs 32a through 32n via the twenty two latches 72a through 72n and lines 82a through 82n are fed both to a check bit generator circuit 230 and a first input of a parity generator/checker circuit 231. The parity generator/checker circuit 231 further has a second input coupled to the parity in signal source 31 via primary latch 71 and output line 81 and depending on the state of the parity input signal on input 31 sends a parity error signal (PERR) on output line 111 to the error logic circuit 100.

Meanwhile the check bit generator circuit 230 is transferring the twenty two inputted data signals to a first input of a syndrome bit generator 232 whose second input is coupled to the check bit inputs 30a through 30e through the lines 80a through 80e coming from the primary latches 70a through 70e.

The Syndrome bit generator 232 then transfers the twenty two data signals to a first input of a syndrome bit decoder and the six check bits to the error generator 235 which determines if there are either correctable or uncorrectable errors in the received data and provides the appropriate correctable error or uncorrectable error signal to the error logic circuit 100 via either line 109 or 110. The syndrome bit decoder now decodes the twenty-two data bits and transfers them to the data correction circuit 234. In the correction circuit the syndrome bits are selectively Xored with the data inputs consistent with the H-matrix, shown in FIG. 6, with any single bit errors in the data field inverted to correct the error.

The Error Logic block 100 consists of 3 major elements (not shown) which are an error counter, a status register block that contains a plurality of status registers, and an IIC logic block all of which are interconnected through common logic circuits. All of these blocks as well as the interconnecting logic circuits are common and readily available circuits known to those skilled in the art.

More specifically, the error counter is a 16-bit counter that increments as it receives errors inputs (CE, UE or Parity) from the SEC/DED ECC 90. This error counter continues to count errors (until it reaches its full count) even while the status registers are being read out on the IIC bus.

The status register block includes, in the present case, ten eight bit register sets (0-9) which contain information on the data input (D0-21) signals, the check bit signals (C0-5 and Parity In) signals received from the memory controller 19, as well as signals from the memory module 20 (FCC/Parity Mode, SA0-2), the error count, and the syndrome bits (S0-5) which are calculated by the SEC/DED ECC 90. In addition, the ten eight bit registers include an indication of the buffer type (1 to 2 rank enabled buffer or 1 to 4 rank enabled buffer), the buffer die revision, an indication of the buffer vendor, the maximum buffer speed, the driver strength and whether ECC has been bypassed by the application or not.

The IIC Logic block includes the necessary logic to support the "IIC Bus Specifications Version 2.1 January 2000 Standard". In this case the register is an IIC slave where the register is addressed by the DIMM address input range sources (SA0, SA1, SA2) 78a, 78b and 78c and responds to several IIC bus commands—reset, read from the ten (10) Status Registers and the test mode.

The miscellaneous logic circuits interconnecting the above described error counter, status register block and IIC logic block include logic circuits designed to reset the error counters and the ten (10) status registers from either the external reset signal (/RST) source 37 or an internal power-on reset, to load the contents of the ten status registers and logic (including a set of shadow registers) that the IIC logic will send out onto the IIC bus when a IIC bus read occurs, along with some control logic to drive the correctable error (CE) and uncorrectable error (UE) lines out if such an error occurs.

The error bus that provides access to the ten (10) internal status registers (that can be read and reset via an IIC bus) permits the device to be interrogated for additional error information, such as the error type (correctable, uncorrectable or parity error), error count and the memory card location (via the SA0-2 address pins, also shared by the separate SPD EPROM). Other information is also available for diagnostics such as the signals received by the register (address/command, control signals, check bits, parity bit) associated with a CS is active low and the syndrome bits so that they can be decoded to determine, in the case of a failure, which of the 28 input signals (22 'CS-gated plus 6 check bits) failed. The ten eight bit registers further include an indication of the buffer type (1 to 2 rank enabled buffer or 1 to 4 rank enabled buffer), the buffer die revision, an indication of the buffer vendor, the maximum buffer speed, the driver strength and whether ECC has been bypassed by the application or not. These registers will contain information about the first fail, and the error counter will continue to increment until it is reset or reaches the full count (64K). All registers can be reset by writing the Reset Error Bus command on the IIC bus.

The Byte 0: Status Register is the general status bit register that can be read to determine the type of error, the mode and the address of the DIMM (same as the DIMM SPD address).

| Byte 0: Status Register | | | | | | | |
|---|---|---|---|---|---|---|---|
| Bit 7 Extended Status Register (If 1, see Byte 9) | Bit 6 DIMM Address SA2 | Bit 5 DIMM Address SA1 | Bit 4 DIMM Address SA0 | Bit 3 Mode 1=ECC 0=Pty | Bit 2 Parity Error 1=PERR | Bit 1 ECC error 1=UE | Bit 0 ECCerror 1=CE |

Bytes 1 and 2: Error Counter. The 16 bit error counter will count up to 64K errors (FFFF hex) based on any error (CE, UE or Parity Error). Byte 1 is the LSB and byte 2 is the MSB of the error counter. Once the 16-bit counter has counted up to all ones, it will stay all 1s until the error bus is reset. The error counter register will not increment during a IIC read operation but will continue to count errors if they occur.

| Byte 1 (LSB) | | | | | | | |
|---|---|---|---|---|---|---|---|
| Bit 7 E7 | Bit 6 E6 | Bit 5 E5 | Bit 4 E4 | Bit 3 E3 | Bit 2 E2 | Bit 1 E1 | Bit 0 E0 |
| Byte 2 (MSB) | | | | | | | |
| Bit 7 E15 | Bit 6 E14 | Bit 5 E13 | Bit 4 E12 | Bit 3 E11 | Bit 2 E10 | Bit 1 E9 | Bit 0 E8 |

Bytes 3-7 show the polarity of all 28 signals of the addresses and commands plus the check bits and parity bit that were received at the time of the first fail.

| Byte 3: Data Register A (D0–7) | | | | | | | |
|---|---|---|---|---|---|---|---|
| Bit 7 D7 | Bit 6 D6 | Bit 5 D5 | Bit 4 D4 | Bit 3 D3 | Bit 2 D2 | Bit 1 D1 | Bit 0 D0 |
| Byte 4: Data Register B (D8–15) | | | | | | | |
| Bit 7 D15 | Bit 6 D14 | Bit 5 D13 | Bit 4 D12 | Bit 3 D11 | Bit 2 D10 | Bit 1 D9 | Bit 0 D8 |
| Byte 5: Data Register C (D16–21, CS0–1) | | | | | | | |
| Bit 7 CS1 | Bit 6 CS0 | Bit 5 D21 | Bit 4 D20 | Bit 3 D19 | Bit 2 D18 | Bit 1 D17 | Bit 0 D16 |
| Byte 6: Data Register D (CKE0–1, ODT0–1, CS2–3) | | | | | | | |
| Bit 7 RFU 0 | Bit 6 RFU 0 | Bit 5 CS3 0 | Bit 4 CS2 0 | Bit 3 ODT1 | Bit 2 ODT0 | Bit 1 CKE1 | Bit 0 CKE0 |
| Byte 7: Check Bit (C0–5) and Parity Register | | | | | | | |
| Bit 7 RFU 0 | Bit 6 RFU 0 | Bit 5 Check Bit 5 | Bit 4 Check Bit 4 | Bit 3 Check Bit 3 | Bit 2 Check Bit 2 | Bit 1 Check Bit 1 | Bit 0 Check Bit 0/Pty In |

Byte 8: Syndrome Register. Byte 8 shows the syndrome bits associated with the first error. These can be decoded to determine which of the 22 'CS-gated signals or 6 Check Bits caused the fail. Bytes 3-7 show the polarity of all input signals at the time of the fail. FIG. 8 shows the timing diagram used with the present invention.

| Byte 8: Syndrome Bit (0–5) Register | | | | | | | |
|---|---|---|---|---|---|---|---|
| Bit 7 RFU 0 | Bit 6 RFU 0 | Bit 5 Syndrome Bit 5 | Bit 4 Syndrome Bit 4 | Bit 3 Syndrome Bit 3 | Bit 2 Syndrome Bit 2 | Bit 1 Syndrome Bit 1 | Bit 0 Syndrome Bit 0 |

Byte 9 provides operational information such as bit 7, which indicates whether ECC checking is active and bit 6, which indicates the drive strength setting for the drivers, at the time the register contents are interrogated. In addition byte 9 provides useful information regarding the buffer device such as bit 5 (the maximum clock speed that the buffer is intended to operate at), the supplier (the exemplary embodiment allows two suppliers to be uniquely identified via a pre-defined bit assignment), although the use of bit 4 or an additional byte (i.e. byte 10) would permit the unique identification of 4 or more suppliers), and the supplier's die revision (the exemplary embodiment permits unique identification of up to 8 die revisions). Through the use of the contents of byte 9, further information can be obtained regarding the buffer settings at the time of failure, after power-up or at any other time during operation. In addition, systems using the enhanced 4-rank buffer device will be able to electronically detect the supplier code, die revision and speed sort of the buffer devices in the system, without the need to physically inspect the devices, by interrogating the installed memory subsystems containing the subject buffer devices.

This offers a significant advantage should it be necessary to identify installed buffers if issues arise regarding the viability of the devices installed in a system in regard to manufacturing, reliability or related concerns subsequent to the assembly of the memory subsystems.

| Byte 9: Extended Status Register Description Bit (0–6) Register | | | | | | | |
|---|---|---|---|---|---|---|---|
| Bit 7 ECC Bypass 1=Yes 0=No | Bit 6 DS 1=Lo Drv 0=Hi Drv | Bit 5 Speed 1=800 0=667 | Bit 4 RFU | Bit 3 Supplier 1=Supplier A 0-Supplier B | Bit 2 Die Rev | Bit 1 Die Rev | Bit 0 Die Rev |

All the information necessary for one skilled in the art to design this error logic block 100 is included in the H-Matrix shown in FIG. 6 where D0 through D21 refer to the data bits, C0 through C5 refer to the check bits and S0 through S5 refer to the syndrome bits.

FIG. 9 depicts a variety of configurations that may be implemented using the enhanced 4-rank enabled buffer chip 21 described herein. As shown in FIG. 9, the buffer chip 21 may be utilized on existing memory modules that support one or two ranks of memory devices, thereby eliminating the need to upgrade to new memory modules to utilize the enhanced 4-rank enabled buffer chip 21. In addition, FIG. 9 depicts two of the enhanced 4-rank enabled buffer chips 21 being utilized on a high density 4 rank memory module to access the 4 ranks of memory devices.

A one buffer chip configuration 902 is depicted in FIG. 9 as an interconnect drawing showing the interconnections between the enhanced 4-rank enabled buffer chip 21 and the EPROM 302 (shown as VPD (Vital Product Data) but could also be used to contain SPD, or Serial Presence Detect information) on an exemplary memory module having 9 eight bit wide or 18 four or eight bit wide memory devices and a single 4-rank enabled buffer chip 21. As shown in configuration 902, outputs from the buffer chip 21 include an indication of whether the error is a correctable error (CE) or an uncorrectable error (UE) as well as the corrected (if error is correctable) command and address information, which connect to memory devices 22. The internal status registers (bytes 0 through 9) of the buffer chip 21 can be accessed via an IIC bus by operating the SCL and SDA pins that connect to the buffer (2, 140 and 2, 141 respectively) consistent with the IIC Bus Specification. At the SA0-2 input pins a memory card location is specified. The IIC data clock (SCL) and IIC data input (SDA) query the status registers on the buffer chip 21. As depicted in configuration 902, the CS2 and CS3 inputs are disconnected and thus, the enhanced 4-rank enabled buffer chip 21 can operate on a standard, prior art, one or two rank memory module without requiring a system upgrade.

A two buffer chip configuration 904 is depicted in FIG. 9 as an interconnect drawing showing the interconnections between the enhanced 4-rank enabled buffer chips 21 and the EPROM 302 on an exemplary memory module having 36 four bit wide memory devices and two 4-rank enabled buffer chips 21. The CS2 and CS3 inputs are disconnected, and thus, the enhanced 4-rank enabled buffer chip 21 can operate on a standard, prior art, one or two rank memory module without requiring a system upgrade. The status registers in buffer 1 can be separately accessed from the status registers in buffer 2 due to the fact that the SA2 pin on buffer 1 is tied to ground, whereas the SA2 pin on buffer 2 is tied to Vdd. The SA0 and SA1 inputs for both buffers are connected to the SA0 and SA1 pins on the module, resulting in the two buffers having unique addresses. Using this method, up to 4 modules, each with 2 buffers, can be installed in a system that permits independent addressing of the status registers in the 8 total buffer devices (using a unique SA0 and SA1 input combination for each of the four module positions in conjunction with the SA2 wiring shown).

A two buffer chip configuration 906 is depicted in FIG. 9 as an interconnect drawing showing the interconnections between the enhanced 4-rank enabled buffer chips 21 and the EPROM 302 on an exemplary memory module having 72 four bit wide memory devices and two 4-rank enabled buffer chips 21. As depicted in configuration 906, the buffer one has a CS0 signal connected to the CS0 pin and a CS1 signal connected to the CS1 pin, and register two has a CS2 signal connected to the CS0 pin and a CS3 signal connected to the CS1 pin.

As depicted in FIG. 9, the enhanced buffer chips 21 described herein may be utilized in a first mode with existing memory modules that support one or two ranks of memory devices and in a second mode with high density memory modules that support four ranks of memory devices with up to 72 memory devices. The second mode is executed when two buffer chips 21 are coupled together on a memory module with all four of the chip selects (CS0, CS1, CS2 and CS3) being utilized to access different ranks of memory devices. The enhanced buffer chips 21 include 2 additional chip select input lines, but continue to perform the same functions, have the same pin counts, and have the same outputs as prior art buffer devices, therefore, the enhanced buffer chips 21 can be interchanged with prior art buffer devices by disconnecting the 2 additional chip select input lines.

FIG. 10 is an interconnect drawing showing an exemplary embodiment of the chip select wiring at the inputs and outputs of the enhanced 4-rank buffer chip 21 when used on a memory module that supports up to four ranks of memory devices. Two buffer chips 21 are required in this exemplary embodiment to drive all of the DRAM devices at the intended operating frequencies. As depicted in FIG. 10, buffer chip 21a accesses the first and second rank (CS0 and CS1) of memory devices located on the left and right sides of the memory module and buffer chip 21b accesses the third and fourth rank (CS2 and CS3) of memory devices located on the left and right sides of the memory module Although not shown in this figure, the exemplary buffer includes two copies of each chip select output, with one copy (e.g. CS0A) wiring to the first rank of DRAMs 1002 on the right side of the DIMM and the second copy (e.g. CS0B) wiring to the first rank of DRAMs 1002 on the left side of the DIMM. In the exemplary embodiment for the module shown in FIGS. 3A and 3B, the DRAMs 1002 are wired such that each of the two buffers drive one copy of each chip select (e.g. "/CSx") output to 10 DRAMs located to one side of the buffer and 8 DRAMs located to the other side of the buffer and on the same side of the buffer as the first DRAMs (18 DRAMs in total). In the exemplary embodiment for the module of FIGS. 3A and 3B, the buffer driving /CS2 and /CS3 is located on the front of the DIMM, and the buffer driving /CS0 and /CS1 is located on the back of the DIMM. Alternate exemplary embodiments may swap the location of the buffers, or may re-drive /CS0 and /CS2 in one buffer device and /CS1 and CS3 in a second buffer device, while not straying from the teachings described herein. Address and command wiring is fully described in the text associated with FIGS. 3A-3D. Note that in this exemplary embodiment, the wiring to the chip select inputs of buffer chip 21b is swapped between CS0/1 and CS2/3. As depicted in FIG. 10, the buffer chip 21 is operable with as few as one rank of memory devices (e.g., with only one chip select input line being selectable) and as many as four ranks of memory devices (e.g., with all four chip select input lines being selectable).

FIG. 11 is a table describing the IIC addressing associated with the one or more buffer chips 21 utilized in memory modules implementing exemplary embodiments, when either one or two registers, or buffer chips 21, are installed on a given memory module. In exemplary embodiments, the SA2 is hard-wired on two and four rank memory modules so that the internal status registers can be read from each buffer chip 21, as previously described. Referring to FIG. 11, column 1102 is the slot in the memory system being occupied by the memory module and column 1104 is the binary IIC address associated with the memory module slot in column 1102. For memory modules having one buffer chip 21, the IIC address correlates to the slot being occupied by the memory module as shown in column 1106. For memory modules having two buffer chips and up to four ranks of memory devices, the IIC address is doubled up as shown in column 1108. The table in FIG. 11 shows the IIC addresses for four rank memory modules with two buffer chips 21. For a four rank memory module located in slot 1 of the memory system, IIC addresses 0 and 4 are utilized to uniquely access the two buffer chips 21, whereas IIC addresses 1 and 5 are utilized to uniquely access the two buffer chips 21 located on a memory module in slot 2 of the memory system, and so on. Therefore, only four DIMM slots can be utilized with 4 rank memory modules containing 2 buffer devices. However, twice the memory density (up to 72 memory devices per memory module) is being supported in the same four slots (before limit was up to 36 memory devices on each memory module). FIG. 11 shows that in exemplary embodiments, memory modules having one or two ranks of memory and a single buffer chip 21 can be installed in up to eight system module slots, whereas memory modules having up to four ranks of memory devices are limited to up to four memory system module slots, due to such factors as the bus loading on the data bus, overall system power, unique addressability of the internal registers of the buffer devices, etc. This limitation may not hold true in all applications, but is applicable in the exemplary embodiment described herein.

In order to detect if the module(s) installed in the server can properly function in the intended application, monitor the address and control bus integrity, correct errors on the address and control bus, report errors and log and counts errors it is necessary that the DIMM error bus be functional and correctly accessed using the industry IIC protocol and the SA 0-2 bits such that the DIMM can provide a byte of data which includes Byte 0 discussed above. This is achieved by reading the SA 0-2 bits on bits 4, 5, and 6 of the Byte 0 to verify that they match the address of the memory module being interrogated, verifying that bit 3 (the ECC flag bit) is a "1" or high level and verifying that bit 7 of Byte 9 is set to a "1" or high level while the module is programmed to operate with ECC enabled. This proves a unique signature that indicates that the buffer/module combination is intended for use with error checking and correction on the address and control bus. If the correct register values are not obtained, the module is incapable one or more of monitoring the address and control bus integrity, correcting errors on the address and control bus, reporting errors or logging and counting detected errors.

Parity error reporting in the present invention is realized by delivering the parity signal one cycle after the address and command to which it applies, and driving the error line low, i.e., "0" two clock cycles after the address and command bits are driven to the DRAMs from the memory interface chip if an error is detected. After holding the error line low for only 2 clock cycles, the driver will be disabled and the output permitted to return to an un-driven state (high impedance) allowing this line to be shared by multiple modules.

The invention also provides a means for and a method for adjusting the propagation delay for signals on the memory module that are not included in the ECC circuitry such that the signals can be selectively re-driven within one or two clock cycles. This results in a significant increase in module operating speed.

Moreover by operating the memory module in parity mode, unused ECC check bit inputs can be held at a low level, i.e., "0" thus ensuring that these inputs are at a known and quiescent state.

Finally the module of the invention may be operated as if it were a conventional non-ECC protected module, by effective removing the secondary registers (post-ECC) from the delay path by setting the /ECC Mode control pin to a high level, i.e. "1".

In summary, the present invention is an enhanced function 4 rank-enabled 28 bit 1:2 buffer/register, intended for use on main memory modules having one to four ranks of memory devices. The buffer, of the present invention, includes addressability for up to 4 ranks of memory devices and includes ECC logic to correct single bit errors and permit continuous memory operation independent of the existence of these errors. A parity operating mode is also provided, in conjunction with error reporting circuitry to permit the system to interrogate the device to determine the error condition.

The present invention also provides CS gating of key inputs through the use of CS0, CS1, CS2, CS3 and CS Gate Enable. As a means to reduce device power, the buffer's internal latches will only be updated when one or more of the CS inputs are active low (and CS Gate Enable at a high level) at the rising edge of clock. The 22 'CS-gated signals associated with this function include addresses (addr 0:15, BA 0:2). RAS, CAS, WE—with the remaining signals (CS, CKE, ODT) continuously re-driven at the rising edge of every clock as the re-drive of these inputs by the buffer does not require that one or more of the CS inputs to be at a low level. The CS gating function can be disabled by tying CS Gate Enable low enabling all internal latches to be updated on every rising edge of clock. This novel use of CS gating reduces the power dissipation of the buffer device and attached memory devices when any of the gated inputs (addr 0:15, BA 0:2) transition, as the transitions will not propagate through the buffer(s) to the memory device(s), thereby causing circuitry within the buffer and memory devices to switch, unless one or more of the CS inputs to the buffer(s) are at a low level (selecting the buffer and associated memory device(s). As is well known in the art, overall power dissipation can be minimized by eliminating unnecessary transitions of circuitry that is not associated with an intended operation.

Programmable delay for un-gated inputs (/Delay CKE-ODT) is also provided. For the pins associated with CKE and ODT (DRAM signals), the inputs will be latched and re-driven on each rising edge of CLK, independent of the state of the chip select (CS). However, since some controllers may be designed with limited flexibility regarding latency for these signals vs CS, Addr, RAS, CAS and WE. a delay block can be selected to re-align the timing relationships which are offset by one clock cycle when the error correction code is enabled.

Also for all inputs gated by CS, the on-chip SEC/DED ECC logic is enabled and the signal received on CHK0/Parity In is received as check bit 0 via a programming pin (/ECC Mode low). This ECC logic will operate across 28 inputs (22 CS-gated inputs and the 6 check bits), and will correct all single bit errors present on the 22 CS-gated inputs. /Error (CE) will be driven low for two clocks and errors will be counted and latched in the Error Bus Registers for the 28 inputs. Any double bit error will also be detected (as well as any error that is not correctable), and will be reported on the /Error (UE) error line (driven low for two clocks) and in the Error Bus Registers. Although CS0-3 are not included in the ECC logic, the propagation delay of the CS output signals will track the signals included in the ECC logic (1 additional clock of latency).

In addition to the above ECC mode, the same 22 CS-gated signals can be operated in 'parity mode (/ECC Mode high), whereby the signal received on CHK0/Parity In is received as parity to the register 1 clock later than the 'CS-gated inputs. The received parity bit is then compared to the parity calculated across these same inputs by the register parity logic to verify that the information has not been corrupted. The 22 'CS-gated signals will be latched and re-driven on the first clock and any error will be reported two clocks later via the /Error (UE) line (driven low for two clocks) and in the Error Bus Registers. No correction of errors will be completed in this mode. The convention of parity is odd parity (odd numbers of 1's across data and parity inputs equals valid parity).

The /RST pin is used to clear all internal latches (including the error registers), and all outputs will be driven low quickly except the error lines which will be driven high.

The error reporting circuitry, of the present invention is included to permit external monitoring of device operation. Two open-drain outputs are available to permit multiple modules to share a common signal pin for reporting an error that occurred during a valid command (any /CS=low) cycle (consistent with the re-driven signals). These two outputs are driven low for two clocks to allow the memory controller time to sense the error. /Error (CE) indicates that a correctable error occurred and was corrected by the ECC logic. /Error (UE) indicates that an uncorrectable error occurred and depending on the mode selected is an uncorrectable ECC error or a parity error. Note that the timing of UE is different in parity mode vs ECC mode.

In addition, the error bus, (the ten registers discussed above that can be read and reset via an IIC bus) is available to permit the device to be interrogated for additional error information, such as the error type (correctable, uncorrectable or parity error), error count and the memory card location (via the SA0-2 address pins, also shared by the separate SPD EPROM). Other information is also available for diagnostics such as the signals received by the register (address/command, control signals, check bits, parity bit) when a CS is active low and the syndrome bits so that they can be decoded to determine which of the 28 input signals (22 CS-gated plus 6 check bits) failed. These registers will contain information about the first fail, and the error counter will continue to increment until it is reset or reaches the full count (64K). All registers can be reset by writing the Reset Error Bus command on the IIC bus.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links to connect to one or more hub chips and/or memory devices.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM, which is a small circuit board or substrate composed primarily of RAM integrated circuits or die on one or both sides and single row of pins along one long edge. The DIMM depicted in FIG. 1 includes 276 pins in the exemplary embodiment, whereas DIMMs can be constructed with other pincounts while still retaining the same functionality as that described herein.

Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs or any of the expected follow-on devices such as DDR2, DDR3, DDR4 and related technologies such as Graphics RAMs, Video RAMs, LP RAM (Low Power DRAMs) which are often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, buffers, registers, clock devices, passives and other memory support devices and/or components may be attached to the memory subsystem via various methods including solder interconnects, conductive adhesives, socket structures, pressure contacts and other methods which enable communication between the two or more devices via electrical, optical or alternate means.

The one or more memory modules (or memory subsystems) may be connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc.

As used herein, the term memory subsystem refers to, but is not limited to: one or more memory devices; one or more memory devices and associated interface and/or timing/control circuitry; and/or one or more memory devices in conjunction with a memory buffer, and/or switch. The term memory subsystem may also refer to one or more memory devices, in addition to any associated interface and/or timing/control circuitry and/or a memory buffer assembled into a substrate, a card, a module or related assembly, which may also include a connector or similar means of electrically attaching the memory subsystem with other circuitry. The memory modules described herein may also be referred to as memory subsystems because they include one or more memory devices and buffers.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

One or more clocking methods may be utilized within the memory subsystem and the memory system itself, including global clocking, source-synchronous clocking, encoded clocking or combinations of these and other methods. The clock signaling may be identical to that of the signal lines themselves, or may utilize one of the listed or alternate methods that is more conducive to the planned clock frequency (ies), and the number of clocks planned within the various subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the subsystem, or may be based on a clock that is derived from the clock related to the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information.

Initialization of the memory subsystem may be completed via one or more methods, based on the available interface busses, the desired initialization speed, available space, cost/complexity objectives, subsystem interconnect structures, the use of alternate processors (such as a service processor) which may be used for this and other purposes, etc. In one embodiment, the high speed bus may be used to complete the initialization of the memory subsystem(s).

Another initialization method might utilize a distinct bus, such as a presence detect bus (such as the one defined in U.S. Pat. No. 5,513,135 to Dell et al., of common assignment herewith), an IIC bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a point-to-point, multi-drop, daisy chain/cascade interconnect or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the embodiment above, also offers the advantage of providing an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) will help facilitate increased function on integrated devices as well as the integration of functions previously implemented on separate devices. This integration will serve to improve overall performance of the intended function, as well as promote increased storage density, reduced power, reduced space requirements, lower cost and other manufacturer and customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods described herein. Any or all of the various elements may include error detection and/or correction methods such as CRC (Cyclic Redundancy Code), EDC (Error Detection and Correction), parity or other encoding/decoding methods suited for this purpose. Further reliability enhancements may include operation re-try (to overcome intermittent faults such as those associated with the transfer of information), the use of one or more alternate or replacement communication paths to replace failing paths and/or lines, complement-re-complement techniques or alternate methods used in computer, communication and related systems.

The use of bus termination, on busses as simple as point-to-point links or as complex as multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage or another signal. The termination device(s) may be part of a passive or active termination structure, and may reside in one or more positions along one or more of the signal lines, and/or as part of the transmitter and/or receiving device(s). The terminator may be selected to match the impedance of the transmission line, or selected via an alternate approach to maximize the useable frequency, operating margins and related attributes within the cost, space, power and other constraints.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

This completes the description of the preferred embodiment of the invention. Since changes may be made in the above construction without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. A memory module comprising:
   a rectangular printed circuit board having a first side and a second side, a length of between 149 and 153 millimeters and first and second ends having a width smaller than said length;
   a first plurality of connector locations on said first side extending along a first edge of said board that extends the length of the board;
   a second plurality of connector locations on said second side extending on said first edge of said board;
   a buffer device in communication with the circuit board for accessing up to four ranks of memory devices mounted on the first side and second side of the circuit board;
   power savings means for causing all or a portion of the buffer device to be in an inactive mode in response to current activity at the memory module; and
   a locating key having its center positioned on said first edge and located between 82 mm and 86 mm from said first end of said card and located between 66 and 70 mm from said second end of said card.

2. The memory module of claim 1 wherein the buffer device includes four chip select input lines for selecting between the up to four ranks of memory devices, a first buffer device located on the first side for accessing one or more of the up to four ranks of memory devices and a second buffer device located on the second side for accessing one or more of the up to four ranks of the memory devices not accessed by the first buffer device.

3. The memory module of claim 2 wherein half of the memory devices are mounted on the first side of the circuit board and half of the memory devices are mounted on the second side of the circuit board.

4. The memory module of claim 2 wherein the first buffer device and the second buffer device each include an independently accessible status register block with a plurality of internal status registers and an Inter Integrated Circuit block for transmitting contents of the status registers to an error bus.

5. The memory module of claim 1 further comprising an error correction code (ECC) logic module mounted to the circuit board to identify and correct errors in one or more of address and command data inputs received at the memory module.

6. The memory module of claim 5 further comprising a real time error line for reporting both correctable and uncorrectable errors identified by the ECC logic module.

7. The memory module of claim 1 wherein selected contacts on said first side are coupled to selected contacts on said second side to provide redundant contacts for selected signals sent to and received from one or more of the memory devices, the buffer device and the EPROM.

8. The memory module of claim 1 wherein the memory devices are mounted in one or more of a planar and a stacked fashion.

9. A memory module comprising:
   a rectangular printed circuit board having a first side and a second side, a length of between 149 and 153 millimeters and first and second ends having a width smaller than said length;
   a first plurality of connector locations on said first side extending along a first edge of said board that extends the length of the board;
   a second plurality of connector locations on said second side extending on said first edge of said board;
   a locating key having its center positioned on said first edge and located between 82 mm and 86 mm from said first end of said board and located between 66 and 70 mm from said second end of said board;

a buffer device in communication with the circuit board for accessing up to four ranks of memory devices mounted on the first side and second side of the circuit board, the buffer device receiving input from:
  a first chip select input pin for specifying a first rank of memory devices, the pin located in one or more of the front side of the circuit board a nominal distance of 18.495 mm to the right of the locating key and the backside of the circuit board a nominal distance of 18.495 mm to the left of the locating key; and
  a second chip select input pin for specifying a second rank of memory devices, the pin located in one or more of the front side of the circuit board a nominal distance of 14.495 mm to the right of the locating key and on the backside of the circuit board a nominal distance of 12.495 mm to the left of the locating key; and power savings means for causing all or a portion of the buffer device to be in an inactive mode in response to current activity at the memory module.

10. The memory module of claim 9 further comprising and error correction code (ECC) logic module mounted to the circuit board to identify and correct errors in one or more of address and command data inputs received at the memory module.

11. The memory of claim 9 wherein said buffer device includes one or more of an ECC register and a parity register.

12. A high-reliability high density memory arrangement with a fault tolerant address and command bus for use as a main memory that will achieve the degree of fault-tolerance and self-healing necessary for autonomic computing systems comprising;
  a memory interface chip;
  a memory controller; and
  a memory module having up to four ranks of memory devices, a power savings means for causing all or a portion of the memory module to be in an inactive mode in response to current activity at the memory module, and a buffer device coupled to the memory interface chip and the memory controller via address and command lines such that the memory controller sends address and command information to the register via the address and command lines together with check bits for error correction purposes to the register.

* * * * *